United States Patent
Fujibayashi

(10) Patent No.: US 12,476,644 B2
(45) Date of Patent: Nov. 18, 2025

(54) PLL CIRCUIT

(71) Applicant: Asahi Kasei Microdevices Corporation, Tokyo (JP)

(72) Inventor: Takeji Fujibayashi, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 41 days.

(21) Appl. No.: 18/597,933

(22) Filed: Mar. 7, 2024

(65) Prior Publication Data

US 2024/0356557 A1 Oct. 24, 2024

(30) Foreign Application Priority Data

Apr. 11, 2023 (JP) .................................. 2023-063861
Jan. 16, 2024 (JP) .................................. 2024-004314

(51) Int. Cl.
*H03L 7/093* (2006.01)
*H03L 7/099* (2006.01)
*H03L 7/107* (2006.01)

(52) U.S. Cl.
CPC ............ *H03L 7/093* (2013.01); *H03L 7/0991* (2013.01); *H03L 7/1075* (2013.01)

(58) Field of Classification Search
CPC ..... H03L 7/093; H03L 2207/50; H03L 7/099; H03L 2207/06; H03L 7/0991; H03L 7/0992; H03L 7/197; H03L 2207/00; H03L 7/085; H03L 7/08; H03L 7/06; H03L 7/00
See application file for complete search history.

(56) References Cited

U.S. PATENT DOCUMENTS

| | | | |
|---|---|---|---|
| 5,883,930 A | 3/1999 | Fukushi | |
| 9,020,089 B2 * | 4/2015 | Da Dalt | H03L 7/093 |
| | | | 375/376 |
| 10,530,373 B1 * | 1/2020 | Fridi | H04B 1/0028 |
| 2011/0007859 A1 | 1/2011 | Ueda | |
| 2012/0013409 A1 | 1/2012 | Maeda | |
| 2018/0097522 A1 | 4/2018 | Chillara | |
| 2018/0123537 A1 | 5/2018 | Salle | |
| 2019/0238145 A1 | 8/2019 | Tsuda | |

FOREIGN PATENT DOCUMENTS

| | | |
|---|---|---|
| JP | S6273818 A | 4/1987 |
| JP | 6392592 B2 | 9/2018 |
| JP | 2021002800 A | 1/2021 |

* cited by examiner

*Primary Examiner* — Diana J. Cheng

(57) ABSTRACT

A PLL circuit including a digitally controlled oscillator outputting, as an output signal, a signal having a frequency modulated according to a control signal, a detection unit detecting a difference in at least one of a ratio or a phase of a frequency between the output signal and a reference signal, a digital loop filter smoothing an output indicating the difference output from the detection unit and outputs, as the control signal, a resulting output to the digitally controlled oscillator, a control signal storage unit storing, as a previous control signal, a digital value based on the control signal output from the digital loop filter in a predetermined period immediately before end of a chirp operation period, and a control unit controlling the digital loop filter such that the control signal output from the digital loop filter immediately after start of the chirp operation period is the previous control signal.

18 Claims, 32 Drawing Sheets

200A ial Field

The present invention relates to a PLL circuit.

2. Related Art

Patent Document 1 discloses a "frequency synthesizer capable of reducing an output frequency error of an output signal of a voltage controlled oscillator".

PRIOR ART DOCUMENTS

Patent Document

Patent Document 1: Japanese Patent No. 6392592

DESCRIPTION OF EXEMPLARY EMBODIMENTS

Hereinafter, embodiments of the present invention will be described. However, the following embodiments are not for limiting the invention according to the claims. In addition, not all combinations of features described in the embodiment are essential to the solution of the invention.

Radars have long been used in a wide range of fields such as aviation, astronomy, marine observation, weather observation, and altitude measurement, and in recent years, have been widely used in various fields such as automatic driving. In particular, in recent years, radars using frequencies in the 79 GHz band have been utilized in the automobile field. Further, radars have been used in various applications such as an application of a biometric sensor in which respiration or the like of a living organism is measured in a non-contact manner from a characteristic that a minute change of an object can be captured, and an application of a transmission imaging sensor in which a characteristic that a thin object is transmitted is utilized.

Figure 1:
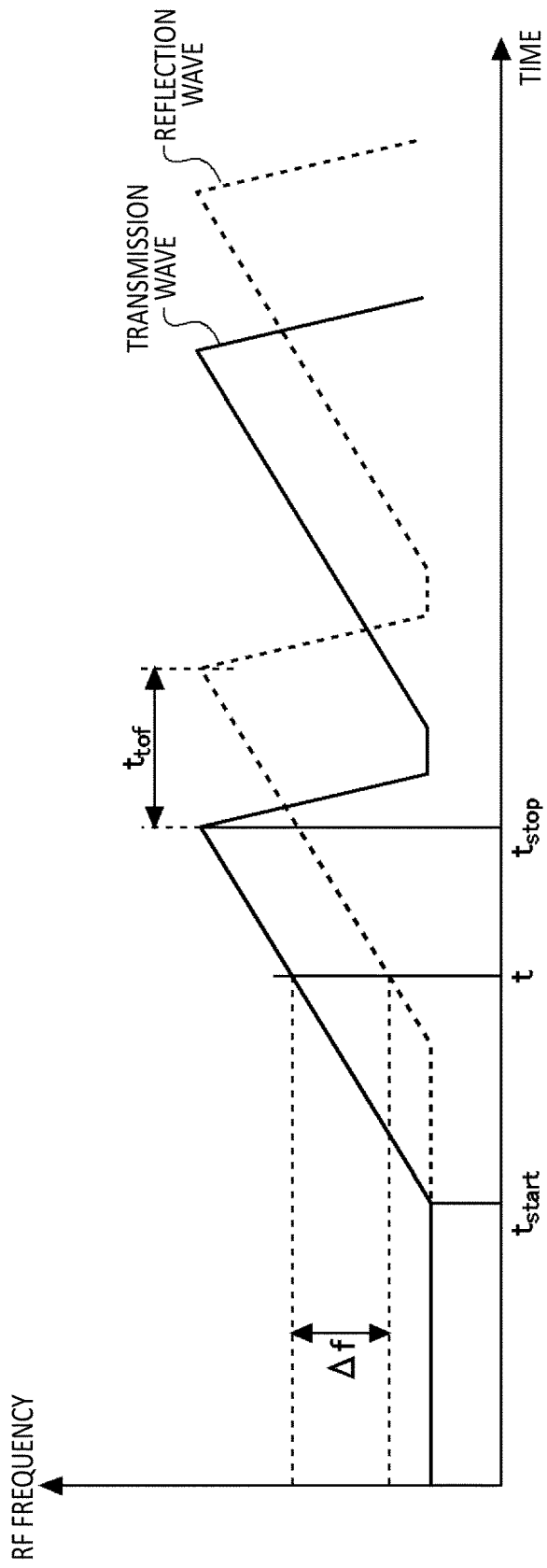
FIG. 1 is a diagram illustrating an example of time and a radio frequency (RF) frequency of a transmission wave and a reflection wave in a radar.

FIG. 1 is a diagram illustrating an example of time and a radio frequency (RF) frequency of a transmission wave and a reflection wave in a radar. The radar is basically a system which measures a distance to a target, and the measurement method thereof is various, but in recent applications, a frequency modulated continuous wave (FMCW) method is widely used.

In the drawing, the temporal change of the frequency in the FMCW method is illustrated. In this method, a transmission source of an electromagnetic wave transmits a continuous wave (CW) of a certain frequency while performing frequency modulation (FM) on the continuous wave over a certain period. The radar receives a reflection wave having bounced back when the transmitted electromagnetic wave hits the measurement target and performs distance measurement.

In the modulation of the FMCW method, the transmission source of the electromagnetic wave gradually changes the frequency of the transmission wave at a constant rate from a time $t_{start}$, changes the frequency to a time $t_{stop}$, and then returns the frequency to the state of the time $t_{start}$. Hereinafter, the modulation operation in which the frequency is changed at the constant rate is referred to as a chirp operation. The radar repeats the chirp operation and the operation of returning the frequency to the frequency at the time $t_{start}$ many times.

Also in the operation of returning the frequency to the frequency at the time $t_{start}$, a modulation method of changing the frequency at a constant rate in a direction opposite to an initial chirp operation also exists as in the initial chirp operation. In this modulation method, the chirp operation is performed twice in one frequency round trip between the frequency at the time $t_{start}$ and the frequency at the time $t_{stop}$.

In the modulation of the FMCW method, the transmission wave of the radar is emitted toward the measurement target by the radar device. When the transmission wave of the radar is emitted to the measurement target, the measurement target emits a reflection wave corresponding to the emitted transmission wave, and the reflection wave returns to the radar. At that time, the reflection wave returns to the radar device with a delay of propagation time $t_{tof}$ of the radio wave corresponding to a distance between the radar device and the measurement target. Here, tof in the propagation time $t_{tof}$ is based on an initial letter TOF of Time Of Flight.

Therefore, when the rate of change in the frequency of the transmission wave, that is, the inclination of the chirp in the chirp operation is constant between the time $t_{start}$ and the time $t_{stop}$, a difference $\Delta f$ between the frequencies of the transmission wave and the reflection wave at a certain time t between the time $t_{start}$ and the time $t_{stop}$ is directly proportional to the TOF. Thus, in the radar in the modulation of the FMCW method, a distance between the transmission source of the electromagnetic wave and the target can be calculated according to the difference $\Delta f$ of the frequency.

In an actual radar system, a baseband signal including a component of a frequency $\Delta f$ obtained by down-converting a transmission wave and a reflection wave by a mixer is sampled for a certain period, and the sampling data is subjected to fast Fourier transformation (FFT) to determine a frequency. When there is a plurality of targets to be measured, a plurality of frequencies corresponding to the distances of the targets also exist in the signal after down-conversion, and thus a plurality of frequency components are extracted after the FFT processing. At that time, for example, in order to separate and identify two objects from the FFT result obtained by reflection from two targets, it is sufficient if two frequencies obtained by at least two targets are divided into different frequency bins after the FFT processing.

A resolution $f_{bin}$ of the frequency bin after the FFT processing is determined based on the measurement time $T_c$ of the signal by Expression 1.

$$f_{bin} = 1/T_c \quad (1)$$

In addition, when a minimum propagation time difference for dividing the FFT bin is denoted as $t_{TOF\_min}$(s) and the inclination of the chirp is denoted as S (Hz/s), Expression 2 is established.

$$f_{bin} = t_{TOF\_min} S \quad (2)$$

Here, when a propagation speed c (m/s) (the speed c is the speed of light in vacuum. c=3.00×10⁸ (m/s)) of the radio wave is used, a minimum distance difference $R_{min}$ for dividing the FFT bin satisfies following Expression 3.

$$2R_{min} = t_{TOF\_min} c \quad (3)$$

Therefore, Expression 4 is established by Expressions 2 and 3.

$$f_{bin} = 2R_{min} S/c \quad (4)$$

Further, when the frequency having changed during the measurement time of the signal is denoted as BW (Hz), Expression 5 is established.

$$Tc = BW/S \quad (5)$$

Following Expression 6 is established from Expressions 1, 4, and 5.

$$R_{min} = c/2BW \quad (6)$$

The minimum distance difference $R_{min}$ for dividing the FFT bin corresponds to a separable distance, that is, a distance resolution in the radar. Therefore, the distance resolution is improved as the frequency width having changed during the measurement widens. Note that, in reality, due to the influence of the window function applied in the FFT processing, the actually separable distance resolution becomes larger than the value obtained by Expression 6, but there is no change in the fact that the better distance resolution can be obtained as the frequency width widens.

As described above, the resolution of the FMCW radar is determined by the frequency width, which is used for the measurement, in the chirp signal regardless of the measurement time. On the other hand, the speed of the chirp operation itself is also required to be increased. Since the limit of the measurable relative speed is improved when the repetition interval of the chirp operations is shortened, for example, in an automotive radar, it is useful to shorten the repetition time of the chirp to such an extent that the maximum relative speed assumed can be captured. Alternatively, in applications such as transmission imaging, it is necessary to measure at many measurement points in order to improve the resolution of the obtained image, and thus, it is necessary to shorten the time of one measurement, that is, one chirp as much as possible.

However, when the inclination of the chirp is made steep in order to shorten the time of the chirp operation, a frequency deviation from an ideal linear response becomes large. As a general tendency, when the inclination of the chirp is doubled, the frequency deviation is doubled. That is, there is a trade-off relationship between performing the chirp at high speed and reducing the linearity error. This frequency deviation, in other words, the linearity error of the frequency modulation is converted into noise at the time of reception in a case where the error is large. The linearity error may increase noise in a received signal and inhibit an accurate measurement.

Therefore, there is a demand for realizing a radar with high speed and high accuracy by shortening the chirp time, reducing the chirp linearity error, and increasing the frequency width used for measurement. In order to generate frequency-modulated transmission waves in the FMCW radar, a frequency synthesizer has an important role. Here, in the FMCW radar, the frequency synthesizer is generally realized by using a phase locked loop (PLL) in most cases, and is also referred to as a PLL synthesizer.

Figure 2:
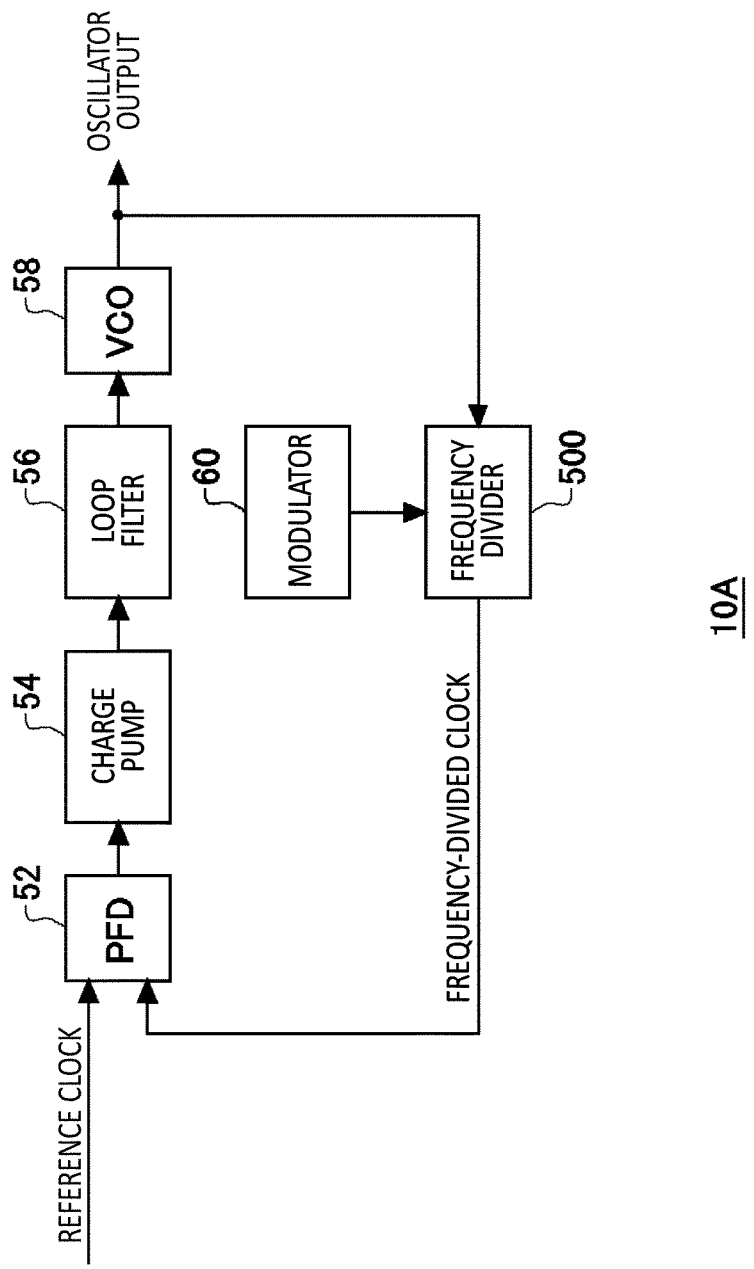
FIG. 2 illustrates an example of a configuration of a general PLL circuit 10A.

FIG. 2 illustrates an example of a configuration of a general PLL circuit 10A. The PLL circuit 10A includes a phase frequency detector (PFD) circuit 52, a charge pump 54, a loop filter 56, a voltage controlled oscillator (VCO) 58, and a frequency divider 500, and these components constitute a closed loop circuit. Further, the PLL circuit 10A includes a modulator 60.

The PFD circuit 52 compares a phase difference between the signal frequency-divided by the frequency divider 500 and a reference clock serving as a reference. The PFD circuit 52 outputs a signal having phase information based on the comparison result. For example, the signal output from the PFD circuit 52 is a pulse signal in which phase difference information is given to the pulse width.

The charge pump 54 converts the signal output from the PFD circuit 52 into a current. The loop filter 56 integrates and filters the current output from the charge pump 54.

The VCO 58 generates a transmission frequency signal based on the signal output from the loop filter 56. The VCO 58 outputs the generated transmission frequency signal to the outside of the PLL circuit 10A and the frequency divider 500.

The frequency divider 500 outputs a signal obtained by dividing the frequency of the transmission frequency signal based on the transmission frequency signal output from the VCO 58. The modulator 60 controls a frequency division ratio of the frequency divider 500. Since the signal output from the frequency divider 500 is fed back to the PFD circuit 52 and compared with the reference signal in the PLL circuit 10A, the transmission frequency signal output by the whole PLL circuit 10A is controlled by the control of the frequency division ratio by the modulator 60.

In many PLL circuits, the charge pump 54 and the loop filter 56 are realized by an analog circuit design technique.

In a case where the charge pump 54 and the loop filter 56 are realized as analog circuit elements, the analog elements are greatly affected by characteristic variations, leakage currents, and the like, and the reduction effect of a circuit mounting area due to miniaturization is weak. Therefore, in recent years, a digital PLL circuit in which a part or all of a PLL circuit is replaced with a digital circuit has been actively used by using a digital circuit technique which easily benefits from a circuit miniaturization technique.

Figure 3:
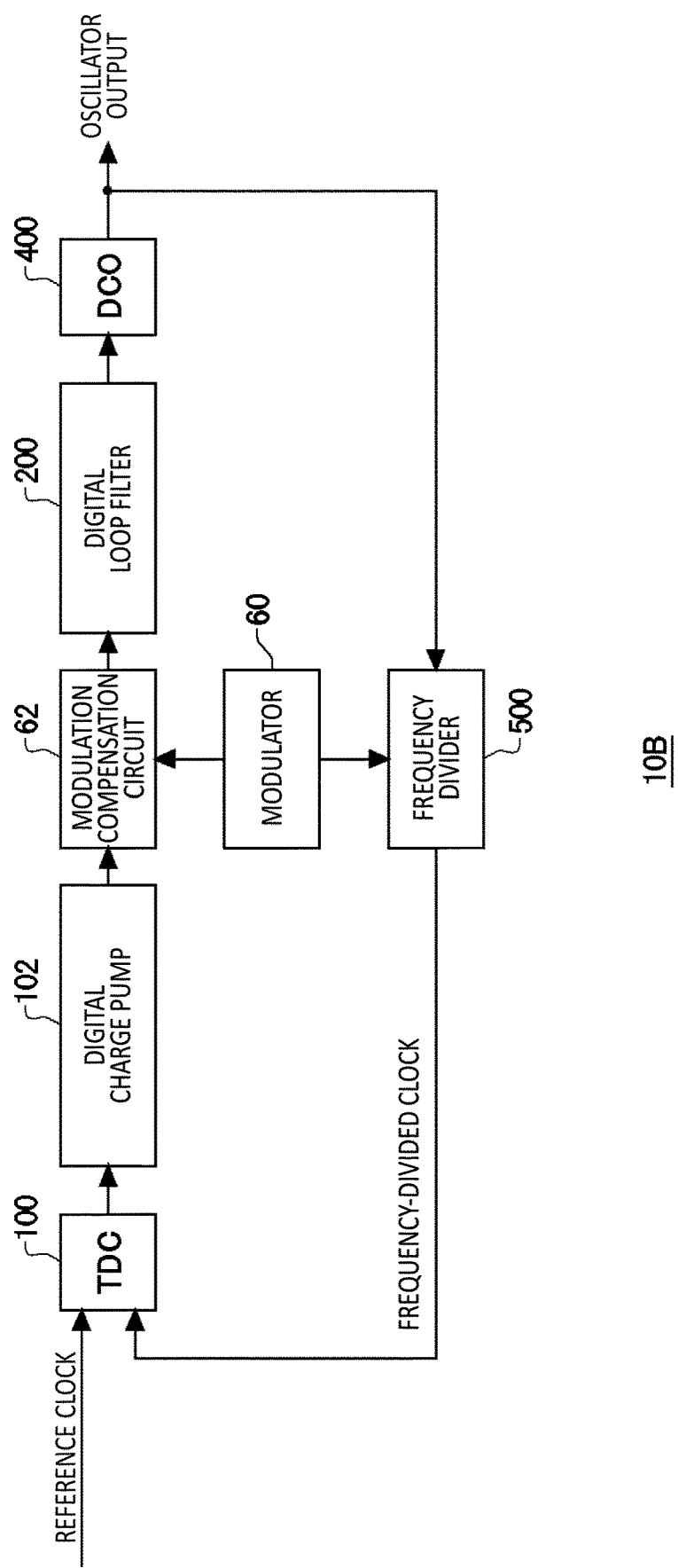
FIG. 3 illustrates an example of a configuration of a digital PLL circuit 10B.

FIG. 3 illustrates an example of a configuration of a digital PLL circuit 10B. The digital PLL circuit 10B includes a time to digital converter (TDC) 100, a digital charge pump circuit 102, a modulation compensation circuit 62, a digital loop filter 200, a digitally controlled oscillator (DCO) 400, and a frequency divider 500, and these components constitute a closed loop circuit. Further, the digital PLL circuit 10B includes the modulator 60. Therefore, the digital PLL circuit 10B of FIG. 3 is different from the PLL circuit 10A of FIG. 2 in that the TDC 100 and the modulation compensation circuit 62 are included instead of the PFD circuit 52, and each element is a digital circuit.

The TDC 100 converts a time difference between the signal obtained by frequency-dividing the transmission frequency signal by the frequency divider 500 and the reference clock into a digital value. The TDC 100 outputs a digital signal based on the time difference. The digital signal output by the TDC 100 has time difference information converted into a digital value.

The digital charge pump circuit 102 converts the digital signal output from the TDC 100 into current. The digital loop filter 200 integrates and filters the current output from the digital charge pump circuit 102. Therefore, the time difference information converted into the digital value by the TDC 100 is input to the DCO 400 via the integration and filtering of the digital charge pump circuit 102 and the digital loop filter 200. The oscillation frequency of the DCO 400 is adjusted by the time difference information.

The DCO 400 outputs a transmission signal controlled by the digital signal, which is a digital value, output from the TDC 100. The DCO 400 outputs the generated transmission frequency signal to the outside of the PLL circuit 10B and the frequency divider 500. For example, the DCO 400 may directly switch the oscillation frequency using a digital value.

In the following, when a digitally controlled oscillator (DCO) is mentioned, the digitally controlled oscillator may have a configuration including a DA converter (DAC: Digital to Analog Converter) which converts a digital signal into an analog signal, and a VCO of an analog circuit which generates, as an output signal, a clock signal having a frequency corresponding to the voltage of the analog signal output from the DAC.

The digital PLL circuit 10B of the present embodiment includes a modulation compensation circuit 62 inserted between the digital charge pump circuit 102 and the digital loop filter 200. In the PLL circuit, delta sigma modulation is performed on the frequency division factor in order to realize a fractional frequency division factor, and quantization noise noise-shaped to a high frequency region by the delta sigma modulation may be added as phase noise to the output signal of the PLL circuit. The modulation compensation circuit 62 is a circuit which cancels the quantization error subjected to the delta sigma modulation and prevents the quantization noise noise-shaped by the delta sigma modulation from appearing in the phase noise.

Figure 4:
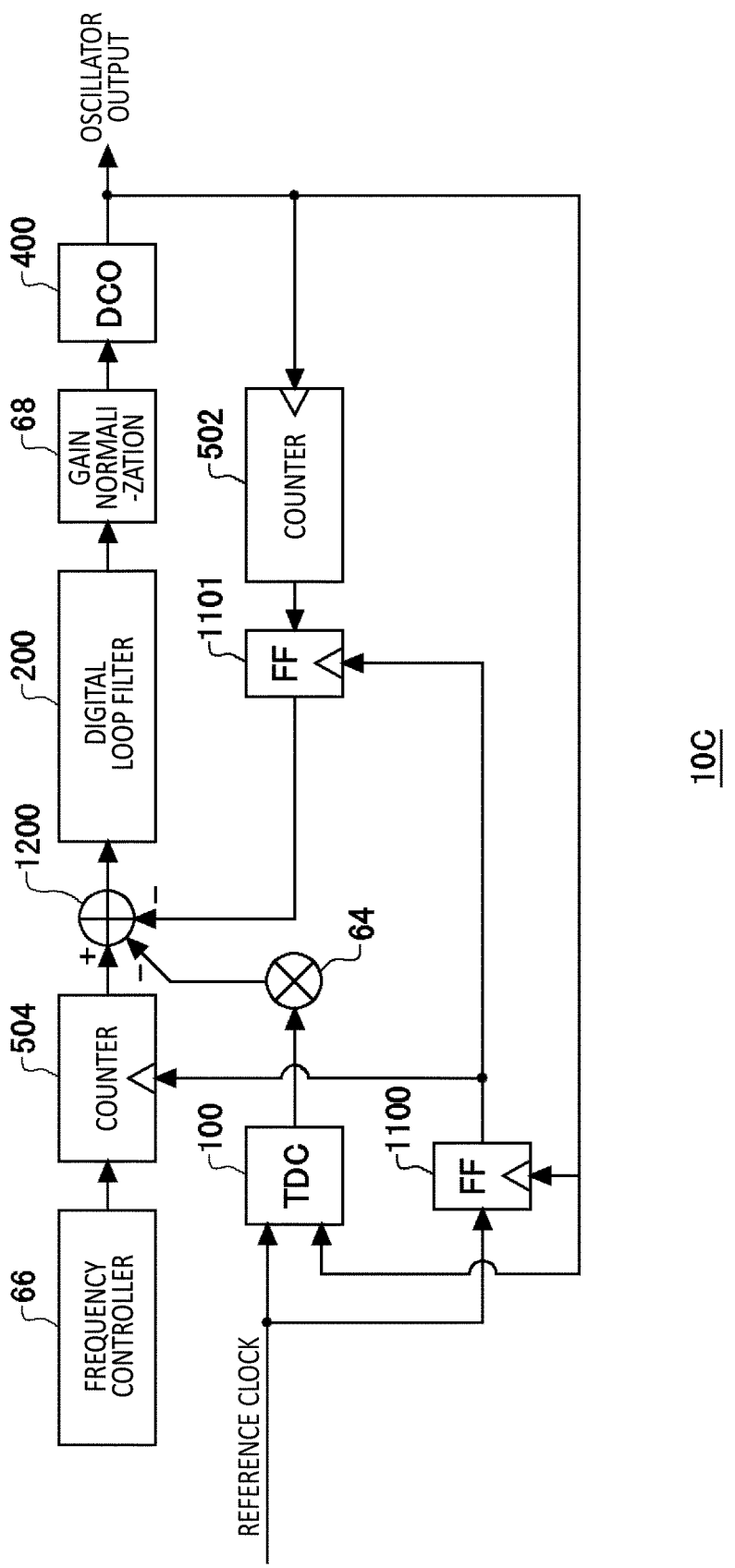
FIG. 4 illustrates an example of a configuration of a digital PLL circuit 10C different from the example illustrated in FIG. 3.

FIG. 4 illustrates an example of a configuration of the digital PLL circuit 10C different from the example illustrated in FIG. 3. The digital PLL circuit 10C includes the TDC 100, a multiplier 64, an adder 1200, a digital loop filter 200, a gain normalization circuit 68, and a DCO 400, and these configurations constitutes a closed loop circuit. The digital PLL circuit 10C further includes a frequency controller 66.

In addition, the digital PLL circuit 10C includes flip-flops 1100 and 1101 and counters 502 and 504. Therefore, in the digital PLL circuit 10C, the flip-flop 1100 and the counter 504, or the counter 502 and the flip-flop 1101, the adder 1200, the gain normalization circuit 68, and the DCO 400 also constitute a closed loop circuit. A signal for controlling the frequency of the whole digital PLL circuit 10C is input to the counter 504 from the frequency controller 66.

The configuration of the digital PLL circuit 10C includes a portion for counting the output of the DCO 400 by the counter 502 and a portion for measuring the phase difference by the TDC 100. Accordingly, the digital PLL circuit 10C divides a frequency ratio of the output of the DCO 400 and the reference clock into the integer part and the decimal part for measurement. Accordingly, in the digital PLL circuit 10C, a difference between the measured frequency ratio and a frequency ratio desired to be set is taken. This output passes through the closed loop configuration via the digital loop filter 200, the gain normalization circuit 68 which normalizes a gain, and the DCO 400 again, and the frequency of the digital PLL circuit 10C converges to the frequency desired to be set.

The digital PLL circuit 10C can have the configuration illustrated in FIG. 4. However, another digital PLL circuit can also be configured which has a mechanism of sensing a frequency deviation by using a difference in a ratio or a phase of a frequency between the output signal of the DCO 400 and the reference clock or both of them, filtering the result with a digital loop filter, and feeding back the result to the DCO 400 to cause the frequency to converge.

Frequency followability or temporal responsiveness such as settling time when the frequency modulation is performed on the PLL circuit depends on a band design of a loop of the PLL circuit. The "settling time" in the PLL circuit refers to time until the PLL circuit reaches a predetermined frequency (and phase).

When the gain in the loop is high, that is, when the loop band is wide, followability when the frequency is changed by the frequency modulation, that is, the response speed becomes high, but an effect of suppressing the phase noise of the VCO 58 and the like decreases, and the phase noise of the PLL output signal increases. Conversely, when the gain in the loop is low, that is, when the loop band is narrow, the response speed with respect to the frequency modulation decreases while the phase noise relatively decreases. Therefore, the relationship between the response speed and the magnitude of the phase noise is a trade-off relationship in the loop band design.

Figure 5:
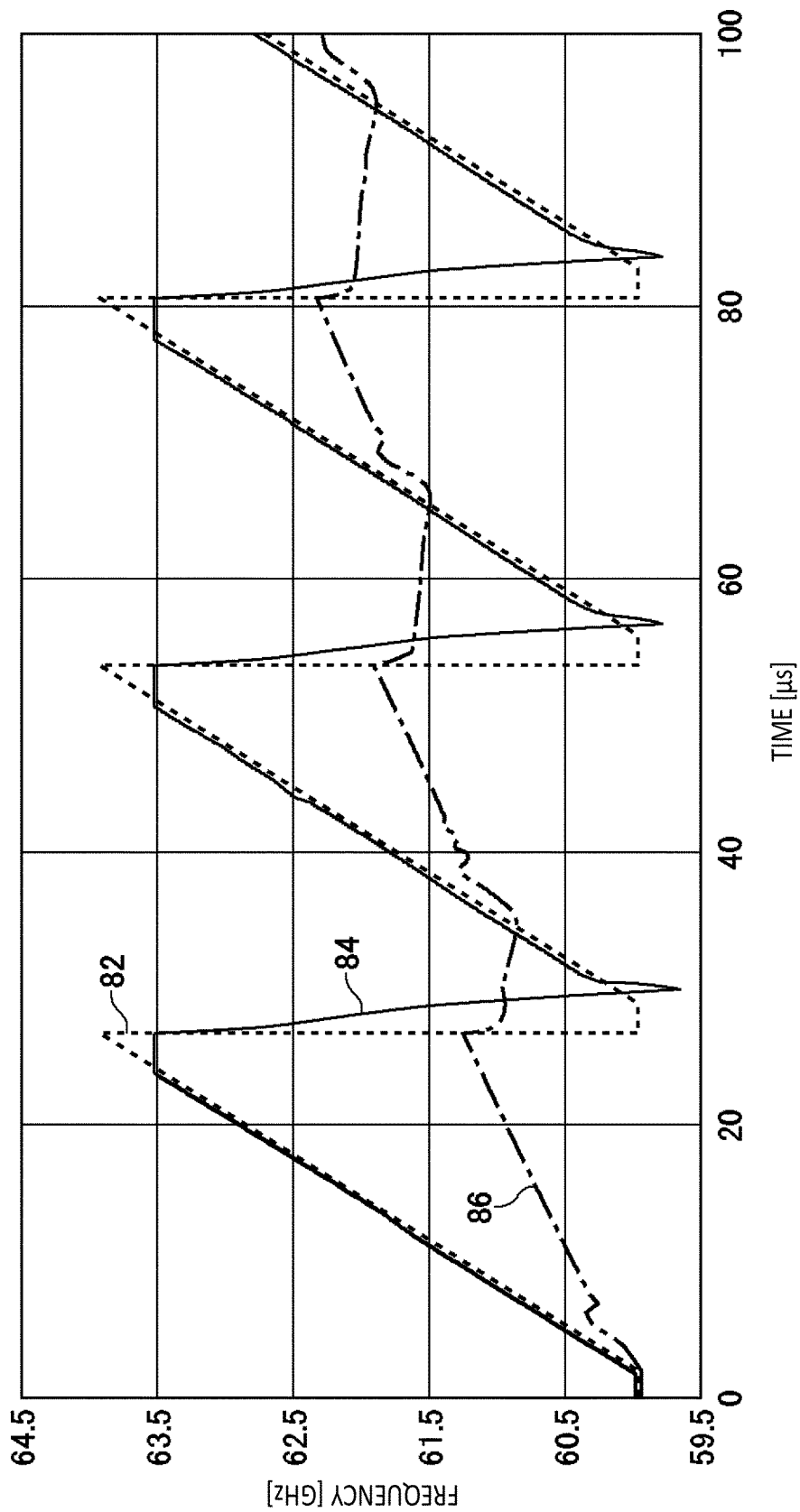
FIG. 5 illustrates a temporal change in a frequency of a PLL output signal when the PLL circuit 10B or the PLL circuit 10C performs an FMCW modulation operation.

FIG. 5 illustrates a temporal change in the frequency of the PLL output signal when the PLL circuit 10B or the PLL circuit 10C performs an FMCW modulation operation. While a graph indicated by a broken line 82 is a frequency response in ideal FMCW modulation, a graph indicated by a solid line 84 is a response when the loop band is wide, and a graph indicated by an alternate long and short dash line 86 is a response when the loop band is narrow.

When the loop band is narrow as indicated by an alternate long and short dash line 86, the response of the loop cannot keep up with the FMCW modulation, and is far from the ideal response. In addition, even when the band is wide as indicated by the solid line 84, the response still deviates from the ideal response. This is because while a wider loop band design improves the responsiveness, there is a limit to widening the loop band in practical design from the viewpoint of loop stability and the like. In the extremely high-speed FMCW modulation, even when the loop band is widened at the expense of the phase noise, a frequency error during the modulation operation cannot be suppressed to be sufficiently small.

Figure 6:
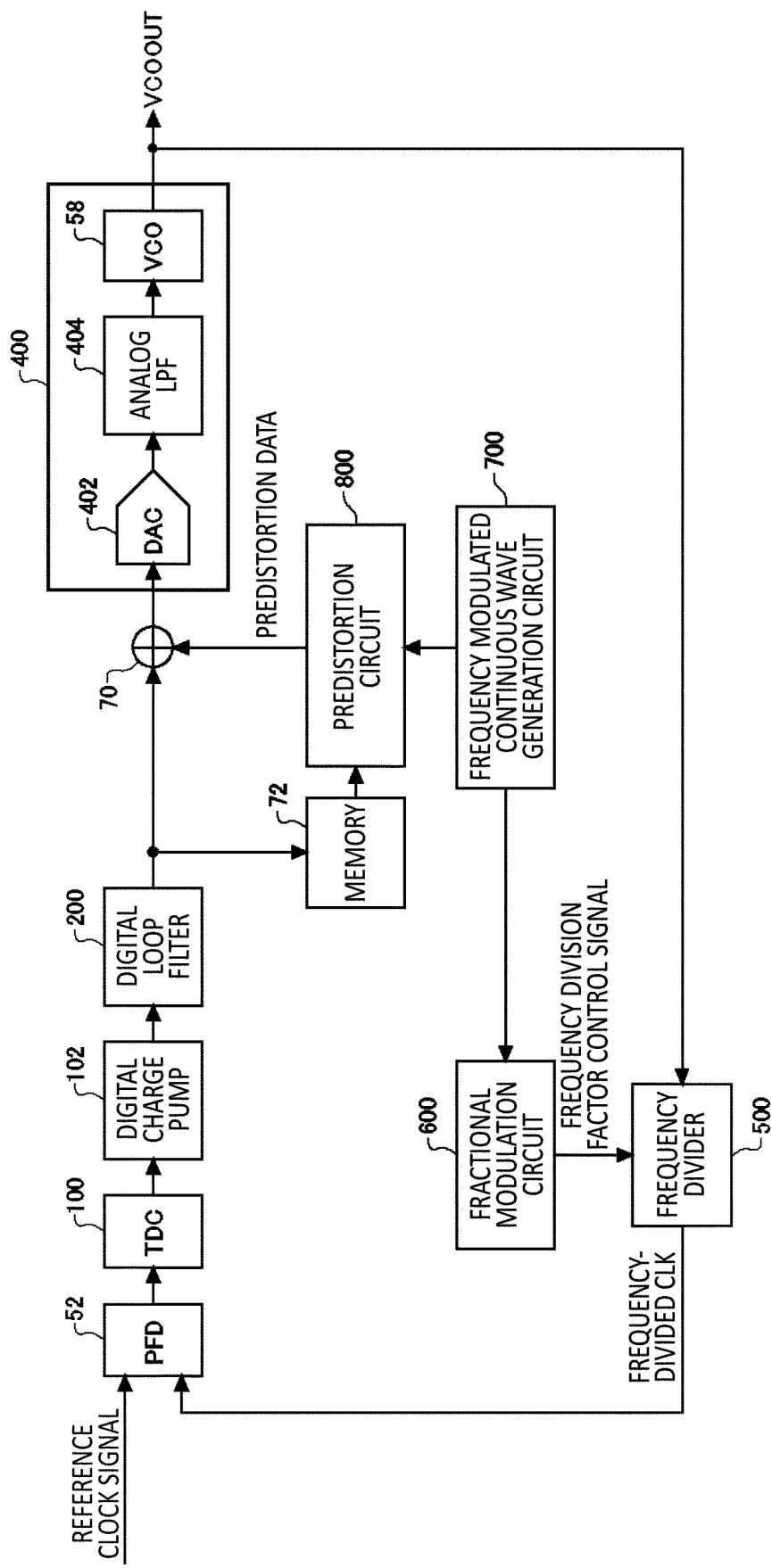
FIG. 6 illustrates a configuration of a PLL circuit 10D capable of high-speed FMCW modulation in Patent Document 1.

Patent Document 1 (Japanese Patent No. 6392592) proposes a configuration in which a predistorted signal is added to a closed loop path in a digital PLL circuit for the purpose of speeding up an operation in frequency modulation and reducing a frequency error, and realizes speeding up. FIG. 6 illustrates a configuration of a PLL circuit 10D capable of high-speed FMCW modulation in Patent Document 1. The PLL circuit 10D includes the PFD circuit 52, the TDC 100, the digital charge pump circuit 102, the digital loop filter 200, an adder 70, the DCO 400, and the frequency divider 500, and these configurations constitute a closed loop circuit. Further, the PLL circuit 10D includes a memory 72, a fractional modulation circuit 600, a frequency modulated continuous wave generation circuit 700, and a predistortion circuit 800 as a configuration for controlling the PLL circuit 10D.

The predistortion circuit 800 performs interpolation processing using the frequency information obtained from the frequency modulated continuous wave generation circuit 700 which controls the FMCW modulation and the measurement data of the digital loop filter 200 for each frequency stored in the memory 72, and adds the result to the output of the digital loop filter 200. Accordingly, when the frequency setting is changed, the input value of the DAC 402 can be set to be extremely close to the set frequency before the response of the closed loop, and an extremely high-speed frequency modulation response can be realized.

The DCO 400 includes a DAC 402, an analog low pass filter (LPF) 404, and a VCO 58. Hereinafter, the operation using the technique of Patent Document 1 will be described in more detail. Calibration is performed as a previous step before actually performing the FMCW modulation operation. In order to store, in the memory 72, a relationship between the digital value input to the DAC 402 and the frequency at which the VCO 58 oscillates, the value of the digital loop filter 200 at each frequency is read in a state where the operation of the predistortion circuit 800 is stopped (that is, a state where the value added by the adder is 0) and stored in the memory 72. In an actual operation, the memory 72 stores values of the digital loop filter 200 for several frequency points picked up in the frequency range to be used.

After the completion of the calibration, when the frequency setting is given, from a correspondence table of the frequency stored in the memory 72 and a digital loop filter value, the value of the digital loop filter 200 at the frequency therebetween is predicted by interpolation or extrapolation in the predistortion circuit 800, and the prediction value is input to the adder 70. Accordingly, the most of the values given to the DCO 400 in realizing the frequency become input values from the predistortion circuit 800. When the predistortion circuit 800 can output an ideal prediction value without an error, it is possible to perform control to a set frequency without involving negative feedback by a closed loop. That is, in such an ideal state, the output of the digital loop filter 200 is 0.

However, in practice, the number of points measured in the calibration operation is finite, and the prediction by the interpolation processing in the predistortion circuit 800 is not perfect, so that the prediction value has a slight error from the ideal value. In order to correct the remaining error, the closed loop of the PLL circuit 10D applies negative feedback. The output signal of the PLL circuit 10D converges to a set frequency. That is, when the frequency of the output signal of the PLL circuit 10D has converged, the output of the digital loop filter 200 is the output of the value corresponding to the error component which has not been corrected by the predistortion circuit 800.

Figure 7:
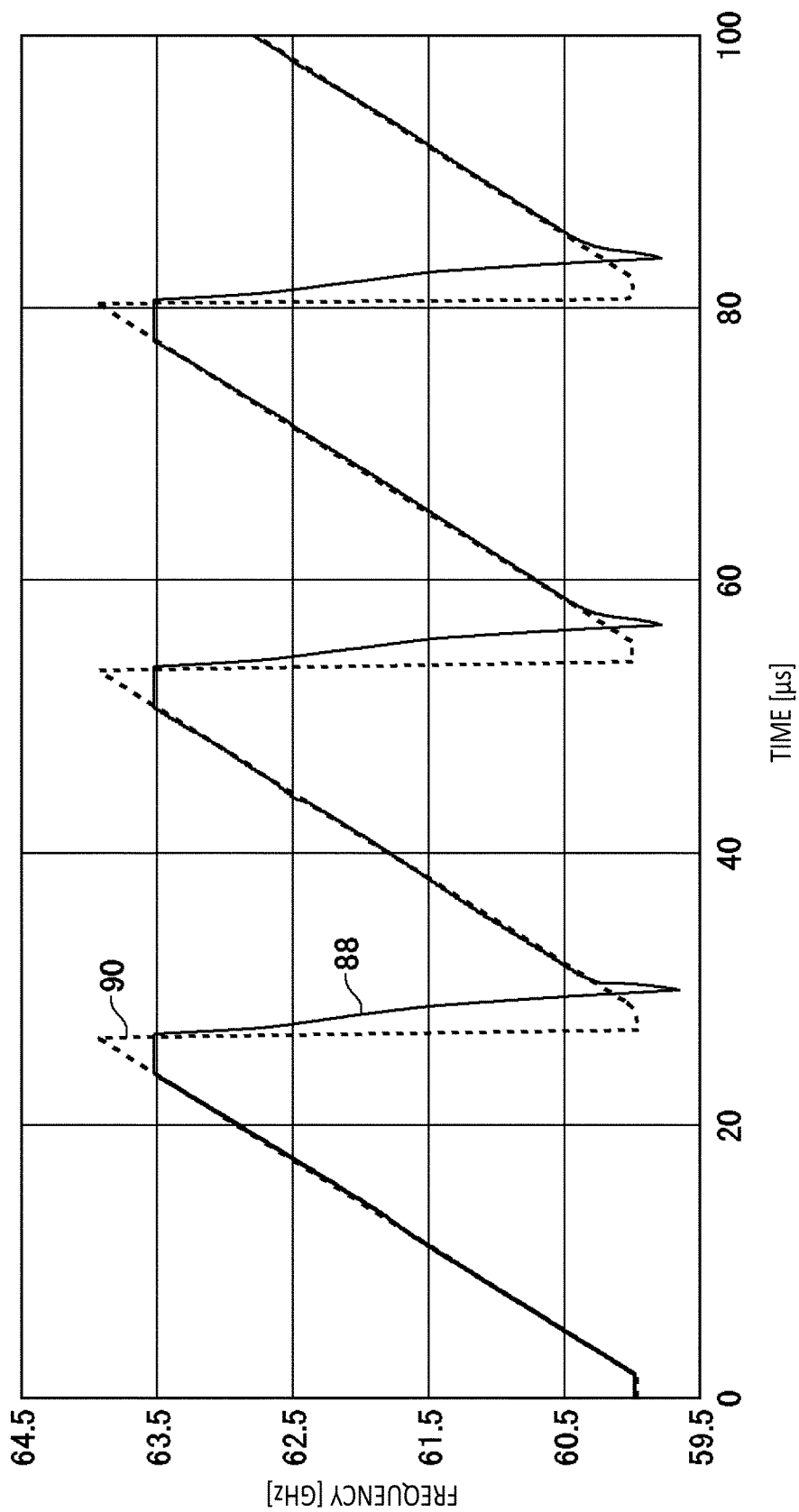
FIG. 7 illustrates a temporal change in the frequency of the PLL output signal when the FMCW modulation operation is performed in a case where the technique described in Patent Document 1 is applied.

FIG. 7 illustrates a temporal change in the frequency of the PLL output signal when the FMCW modulation operation is performed in a case where the technique described in Patent Document 1 is applied. A solid line 88 indicates a response when the predistortion circuit 800 does not perform correction, and a broken line 90 indicates a response when correction is performed. When the predistortion circuit 800 performs correction, more high-speed responsiveness can be realized.

Figure 8A:
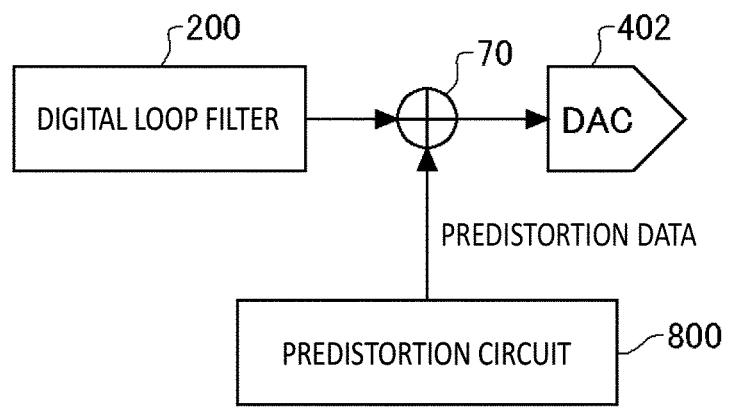
FIG. 8A illustrates a control configuration of the PLL circuit 10D.
Figure 8B:
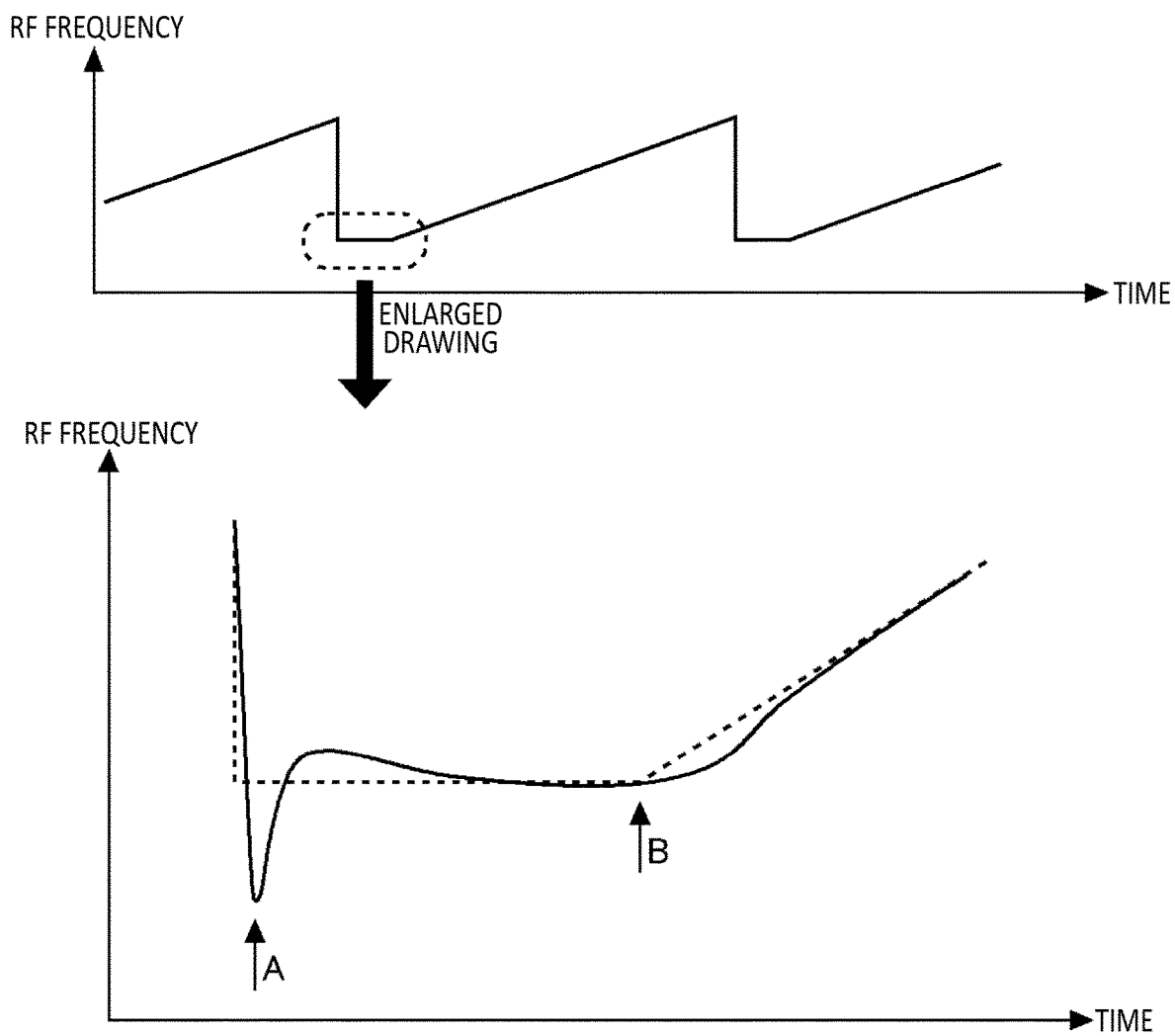
FIG. 8B is a schematic diagram of a time response of a frequency during the FMCW modulation operation when the technique of Patent Document 1 having the control configuration of FIG. 8A is applied.

However, when the operation speed of the FMCW modulation is further increased, the technique of Patent Document 1 still has a problem. FIG. 8B is a schematic diagram of a time response of a frequency during the FMCW modulation operation when the technique of Patent Document 1 having the control configuration of FIG. 8A is applied. In the drawing, a portion surrounded by a broken line in the upper drawing is enlarged and displayed in the lower drawing. In the lower drawing, a broken line indicates an ideal response, whereas a solid line schematically indicates an actual response.

In the operation of rapidly returning the frequency of the FMCW operation, overshoot or undershoot of the frequency may occur immediately after the frequency is returned (a point A in the lower part of FIG. 8B). This occurs, for example, when the stored value has a slight error due to a quantization error, an influence of phase noise, or the like, or when the value interpolated by the predistortion circuit 800 has a deviation from the actual value in the calibration operation of storing the value of the loop filter output at each frequency in the memory. As a cause of other overshoot or undershoot, there is a case where the response of the closed loop deviates from an ideal due to a minute delay of an analog circuit, and an unnecessary error is added.

The frequency error of overshoot or undershoot is counteracted by settling through the response of the closed loop. However, the convergence time of the settling depends on the band design of the loop. Also in the radar system, the phase noise of the signal generated by the PLL circuit 10D greatly affects the performance of the radar. Therefore, it is desirable to reduce the phase noise as much as possible, but on the other hand, when the band of the loop is narrowed in order to reduce the phase noise, the settling time of the error of the overshoot or the undershoot is lengthened. As a result, the waiting time between chirps increases, and thus the measurement interval of the radar may be lengthened.

As described above, in addition to the frequency error which occurs immediately after the frequency is returned (the point A in the lower diagram of FIG. 8B), a frequency error may also occur when the chirp operation in the FMCW modulation operation is started after the frequency becomes a steady state (a point B in the lower diagram of FIG. 8B). This is because, at the time of transition from a steady state in which the frequency is constant to a state in which the frequency constantly changes at a constant rate, the PLL loop follows in a first-order lag system due to a delay in the loop of the PLL circuit 10D.

Figure 9:
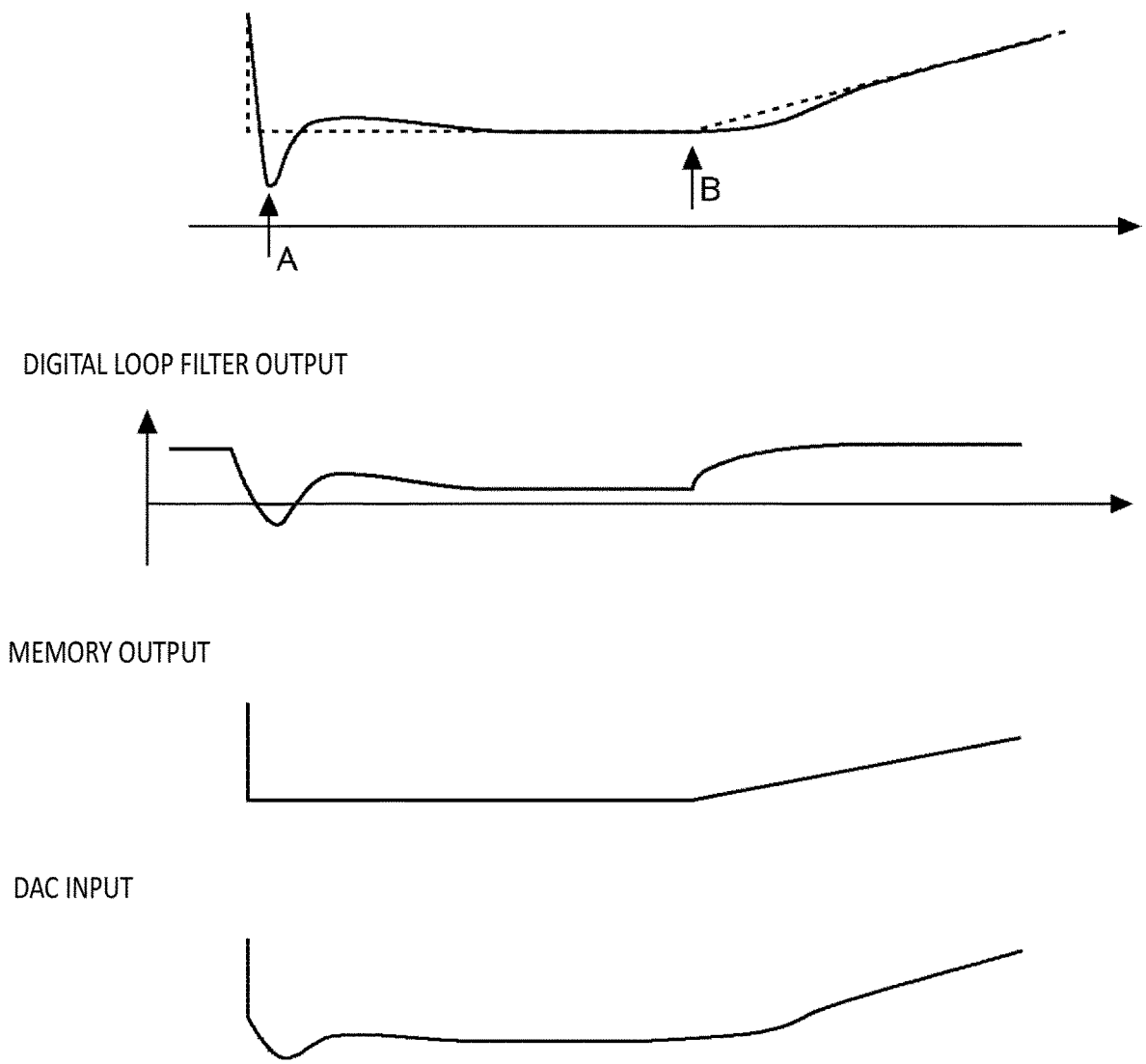
FIG. 9 is a schematic diagram of a time response of an output of a digital loop filter 200, an output of a predistortion circuit 800, and an input to a DAC 402 in the vicinity of points A and B.

FIG. 9 is a schematic diagram of the time response of the output of the digital loop filter 200, the output of the predistortion circuit 800, and the input to the DAC 402 connected to the VCO 58 in the vicinity of the points A and B in the lower diagram of FIG. 8B when the FMCW modulation is performed.

When the feedforward control by the predistortion circuit 800 and the frequency control of the closed loop of the PLL circuit 10D operate at the same timing, the closed loop following in the first-order lag system does not occur. However, in the timing of these controls, the timing may deviate slightly due to an influence of a minute delay in the PLL circuit 10D, for example, a response delay of the VCO 58, and the first-order lag system following behavior may occur. Therefore, when the chirp operation in the FMCW modulation operation is started (the point B in the lower diagram of FIG. 8B and the point B in FIG. 9), the value to which the output node of the digital loop filter 200 is to converge in the closed loop of the PLL circuit 10D in that state also changes finally, and thus settling time until the convergence to the value occurs, and a frequency error may occur.

Since the settling time depends on the band design of the PLL loop, there is also a trade-off with phase noise, and there is also a limit to speeding up. When the settling time is long, the time within the allowable frequency error in the chirp period of the FMCW decreases, and thus the frequency width which can be used for the radar decreases. As a result, the distance resolution of the radar deteriorates, and it is desirable to minimize the settling time immediately after the start of the chirp.

First Embodiment

Figure 10:
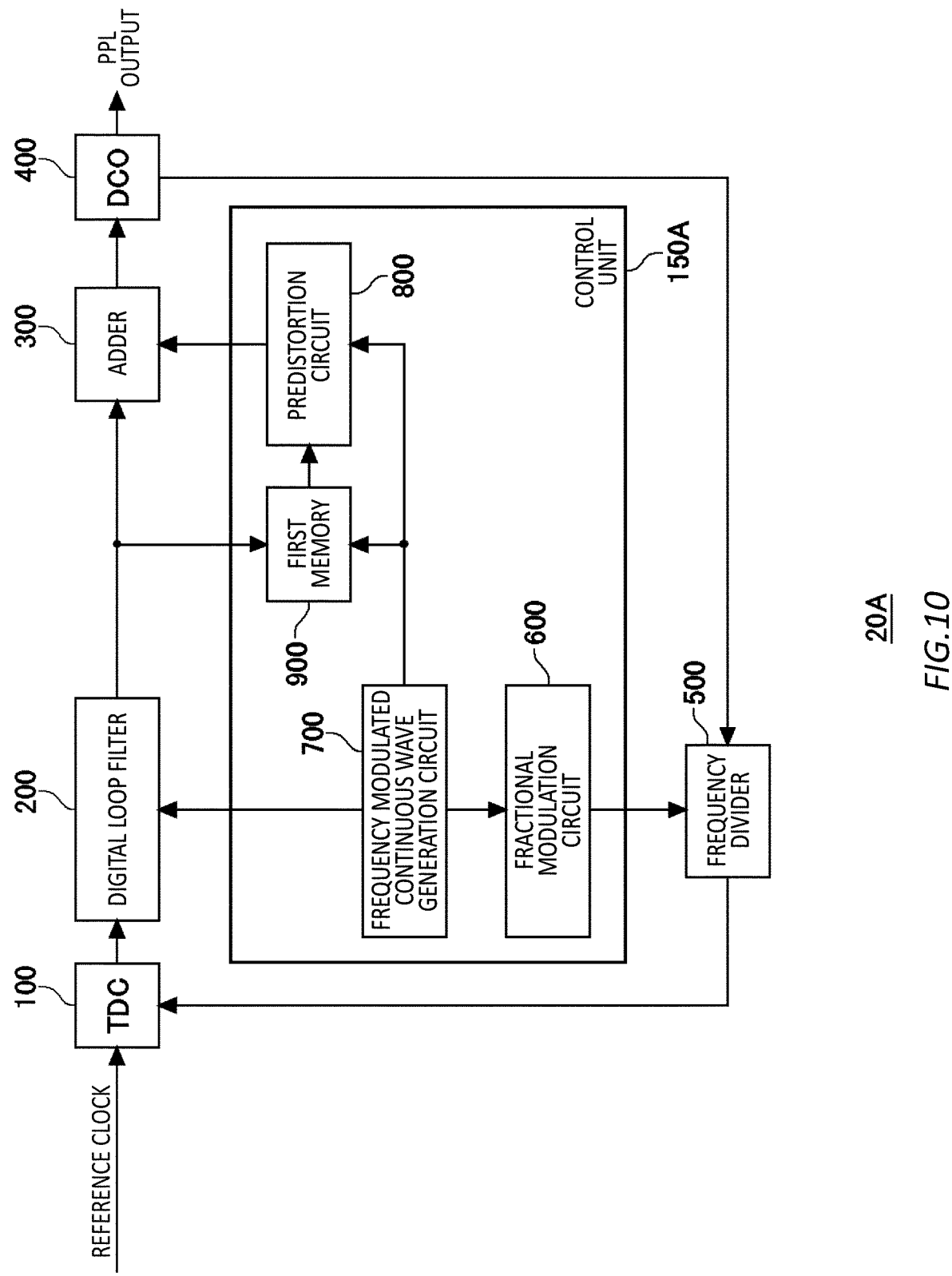
FIG. 10 is a diagram illustrating a PLL circuit 20A according to a first embodiment.

FIG. 10 is a diagram illustrating a PLL circuit 20A according to a first embodiment. The PLL circuit 20A includes the TDC 100, the digital loop filter 200, the adder 300, the DCO 400, and the frequency divider 500, and these components constitute a closed loop circuit. Further, the PLL circuit includes a control unit 150A.

The control unit 150A has a function of controlling the adder 300 and the frequency divider 500 based on the output of the digital loop filter 200. The control unit 150A includes the fractional modulation circuit 600, the frequency modulated continuous wave generation circuit 700, the predistortion circuit 800, and a first memory 900. Hereinafter, the operation of the closed loop of the PLL circuit 10A will be described, and then the control of the control unit 150A will be described.

The TDC 100 compares a ratio and a phase of a frequency between a reference clock serving as an operation reference of the PLL circuit 20A and a signal frequency-divided by the frequency divider 500, and detects the differences thereof. The TDC 100 outputs a digital signal to the digital loop filter 200 according to the comparison result. The reference clock is an example of a "reference signal", and the TDC 100 is an example of a "comparator".

The digital loop filter 200 performs filtering of an appropriate transfer function according to the digital signal output from the TDC 100. That is, the digital loop filter 200 smooths the output indicating the phase difference output from the TDC 100. The digital loop filter 200 outputs the smoothed signal to the DCO 400. The output after the filtering by the digital loop filter 200 is input to the adder 300.

The adder 300 outputs a signal obtained by adding or subtracting two inputs based on the output of the digital loop filter 200 and the output of the predistortion circuit 800. The output of the adder 300 is input to the DCO 400. The adder 300 is an example of a "fourth adder" which adds the output of the digital loop filter 200 and the output of the predistortion circuit 800 and outputs a control signal to the DCO 400.

The DCO 400 is an oscillator which changes an oscillation frequency according to an input value of a digital value to be a control signal. The DCO 400 outputs, as an output signal of the PLL circuit 20A, a clock signal having a frequency modulated according to the oscillation frequency, and also outputs this output to the frequency divider 500.

The frequency divider 500 frequency-divides the output signal, which is the clock signal output from the DCO 400, based on the control of the fractional modulation circuit 600. As described above, the frequency divider 500 and the TDC 100 form a "detection unit" for detecting at least one of the ratio or the phase of the frequency of the reference clock serving as the operation reference of the PLL circuit 20A and the signal frequency-divided by the frequency divider 500. Hereinafter, the function of each circuit included in the control unit will be described.

The fractional modulation circuit 600 controls the frequency division factor of the frequency divider 500. The fractional modulation circuit 600 may control the frequency division factor of the frequency divider 500 by outputting, to the frequency divider 500, a frequency setting signal obtained by performing delta sigma modulation on a frequency information signal from the frequency modulated continuous wave generation circuit 700 described later.

The frequency modulated continuous wave generation circuit 700 controls the FMCW modulation operation. The frequency modulated continuous wave generation circuit 700 outputs, to the fractional modulation circuit 600, the predistortion circuit 800, and the first memory 900, the information of the frequency at which the PLL circuit 20A operates. In addition, the frequency modulated continuous wave generation circuit 700 outputs information regarding the timing and state of the FMCW operation to the digital loop filter 200 in parallel.

That is, the frequency modulated continuous wave generation circuit 700 outputs a frequency information signal indicating frequency information regarding the frequency continuous wave to be output as the output of the PLL circuit 20A from the DCO 400 during the chirp operation. In addition, the frequency modulated continuous wave generation circuit 700 outputs a timing information signal indicating the timing of the chirp operation.

The first memory 900 stores information based on the output of the digital loop filter 200 based on the output of the digital loop filter 200 as necessary. The information stored in the first memory 900 is output to the predistortion circuit 800. The input to the first memory 900 of the present embodiment is the output of the digital loop filter 200, but the input to the first memory 900 may be the output of the adder 300.

In this case, the first memory 900 stores relationship information indicating a relationship between the control signal output from the adder 300 to the DCO 400 and the frequency, which is based on the frequency information signal input from the frequency modulated continuous wave generation circuit 700, of the output signal output from the DCO 400. Therefore, the first memory is an example of a "relationship information storage unit" which stores such relationship information.

The predistortion circuit 800 interpolates the relationship information received from the first memory 900 based on the frequency information received from the frequency modulated continuous wave generation circuit 700. The predistortion circuit 800 outputs, to the adder 300, predistortion data obtained by predistorting the frequency information based on the relationship information.

Although not illustrated in FIG. 10, a modulation compensation circuit may be inserted between the TDC 100 and the digital loop filter 200 in order to cancel the quantization error which has been delta-sigma modulated by the fractional modulation operation.

The PLL circuit 20A may further include the PFD circuit 52 which performs frequency phase comparison before the TDC 100. Therefore, the PLL circuit 20A may be configured such that the reference clock and the output of the frequency divider 500 are input to the PFD circuit 52, a pulse signal corresponding to the phase difference between the reference clock and the output signal of the frequency divider 500 is generated by the PFD circuit 52, and the pulse width of the pulse signal is detected by the TDC 100. Therefore, in this case, the TDC 100 and the PFD circuit 52 are an example of a "comparator" that indicates a difference in the ratio and the phase of the frequency between the output signal of the DCO and the reference clock signal.

The PLL circuit 20A may additionally include an arithmetic circuit such as the digital charge pump circuit 102 between the TDC 100 and the digital loop filter 200 according to the format of the value output from the TDC 100.

Figure 11:
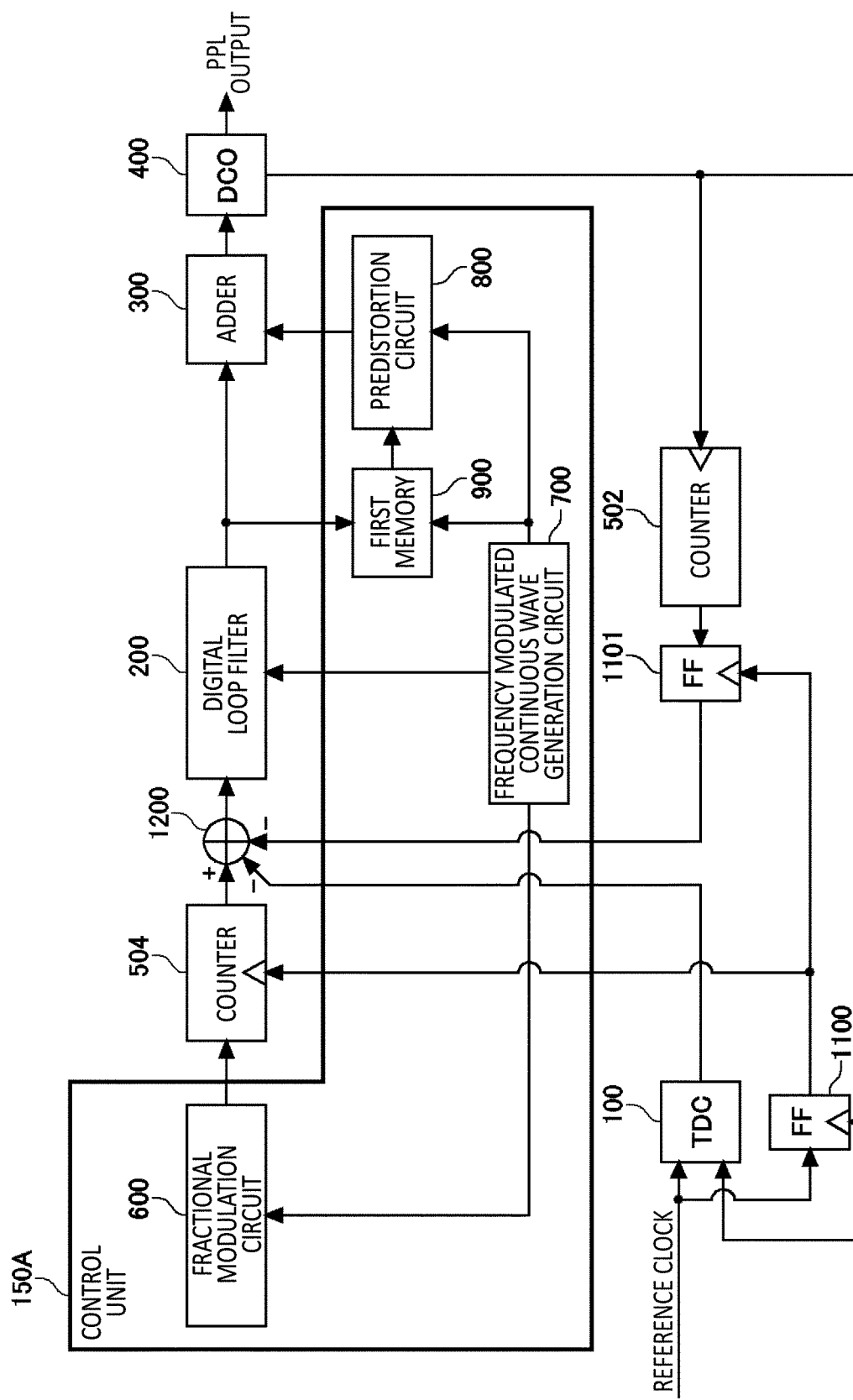
FIG. 11 is a diagram illustrating a PLL circuit 20B according to another example of the first embodiment.

Although the configuration using the frequency divider 500 and the TDC 100 has been described in FIG. 10, the PLL circuit 20B of another example of the first embodiment illustrated in FIG. 11 may be used. In the drawing, the PLL circuit 20B includes the TDC 100, the adder 1200, the digital loop filter 200, the adder 300, and the DCO 400, and these components constitute a closed loop circuit. Further, the PLL circuit 20B includes the control unit 150A including the fractional modulation circuit 600, the frequency modulated continuous wave generation circuit 700, the predistortion circuit 800, and the first memory 900.

In addition, the PLL circuit 20B includes the counters 502 and 504 and the flip-flops 1100 and 1101. This configuration corresponds to a case where the configuration described in FIG. 4 is applied to the present embodiment.

The counter 502 accumulates and counts the number of PLL clocks, which are the outputs of the PLL circuit 20B, based on the output signal of the DCO 400. The counter 502 is an example of a "first counter".

In the present embodiment, the TDC 100 detects the phase difference between the reference clock and the PLL clock, which is the output of the PLL circuit 20B, based on the output signal of the DCO 400.

Each time the reference clock as a reference signal is input to the flip-flop 1100, the flip-flop 1100 outputs an output value based on the value of the PLL clock at that time. Therefore, the counter 504 counts the phase difference based on the flip-flop 1101 and the frequency setting signal obtained by delta sigma modulation of the frequency information signal, which is the output of the fractional modulation circuit 600. The counter 504 is an example of a "second counter". Then, based on the counter 502 and the output of the flip-flop 1100, the flip-flop 1101 outputs the count value of the counter 502.

The adder 1200 adds the output of the counter 504 and outputs a signal obtained by subtracting the output of the counter 502 and the output of the TDC 100. The adder 1200 is an example of an "addition/subtraction circuit". In addition, in the present embodiment, the counters 502 and 504, the TDC 100, and the adder 1200 may constitute a "comparator".

Accordingly, similarly to the digital PLL circuit 10C, the digital PLL circuit 20B divides the frequency ratio of the output of the DCO 400 and the reference clock into the integer part and the decimal part for measurement. Accordingly, in the digital PLL circuit 20B, a closed loop configuration is made in which a difference between the measured frequency ratio and a frequency ratio desired to be set is taken, and the frequency of the digital PLL circuit 20B converges to the frequency desired to be set.

As already described with reference to FIG. 8B, in the FMCW operation, settling waiting time for causing the frequency error to converge is required immediately after the frequency is returned (the point A in FIG. 8B) and immediately after the chirp operation is started (the point B in FIG. 8B). It is desirable to reduce the settling waiting time. As a method for shortening the settling time, a loop band is dynamically switched to increase the speed.

Figure 12:
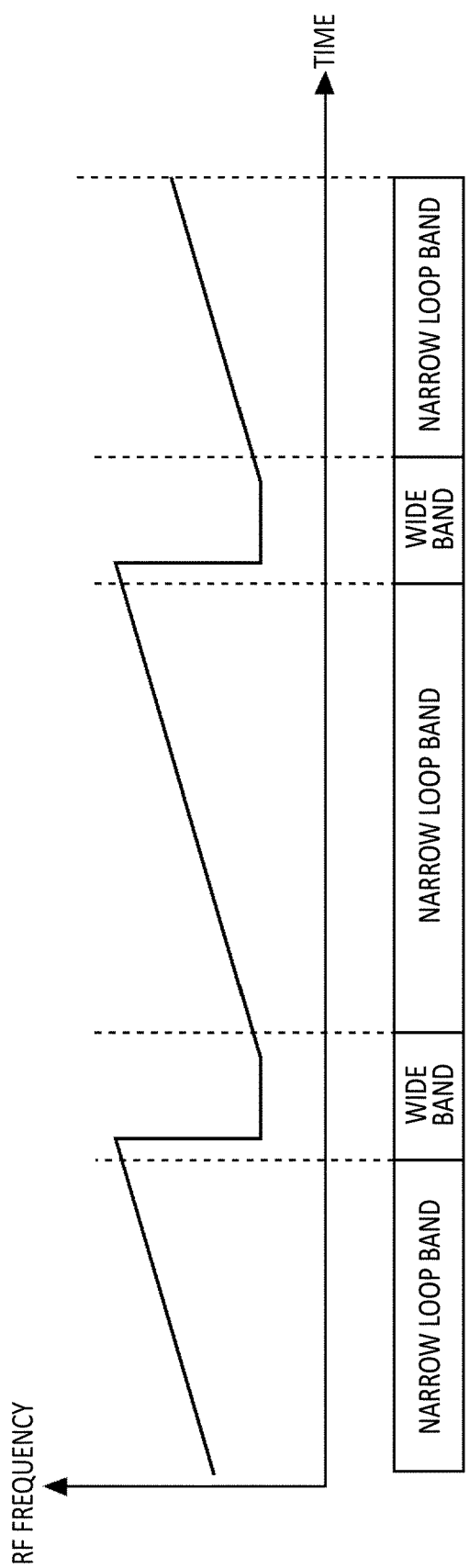
FIG. 12 is a schematic diagram illustrating dynamic switching of a loop band.

FIG. 12 is a schematic diagram illustrating dynamic switching of a loop band. In the FMCW modulation, a loop band design value for a narrowed loop band is used in order to improve the phase noise characteristic of the PLL circuit in the chirp operation period used as the measurement of the radar.

On the other hand, a loop band design value for a widened loop band is used in a period in which the frequency is returned after the end of the chirp operation period (corresponding to a period in which the chirp operation is not performed), the chirp operation is started after waiting for the settling, and predetermined settling waiting time occurring immediately after the start of the chirp operation period is completed. Accordingly, in a period other than the chirp operation period (non-chirp operation period), the settling time becomes faster although the phase noise characteristic is inferior.

Here, in the present specification, a timing "immediately after the start of the chirp operation period" in the chirp operation period may be set to any timing in a period from a time point at which the chirp operation of the PLL circuit starts to a time point at which the radar including the PLL circuit starts data acquisition as the measurement of the radar.

The bandwidth based on the loop band design value for a widened loop band in the period until the settling waiting time occurring immediately after the start of the chirp operation is completed is an example of a "first bandwidth". On the other hand, the bandwidth based on the loop band design value for a narrowed loop band in the chirp operation period used as the measurement of the radar is an example of a "second bandwidth".

The period in which the loop bandwidth is set to the first bandwidth may be a period from immediately before the end of the chirp operation period until the next chirp operation starts after the elapse of predetermined settling waiting time and the end of the chirp operation period.

Here, in the present specification, a timing "immediately before the end of the chirp operation period" in the chirp operation period is set to be a timing after the time point at which the radar including the PLL circuit ends the data acquisition as the measurement of the radar. Further, the timing "immediately before the end of the chirp operation period" is set to a timing before a time point at which the PLL circuit starts to return the frequency to the frequency at the start time point of the chirp operation after the end of the chirp operation period of the PLL circuit and the end of the chirp operation. Therefore, the timing "immediately before the end of the chirp operation period" may be set to any timing in a period from the time point at which the data acquisition as the measurement of the radar is ended to the time point at which the PLL circuit starts to return the frequency.

When the loop band is designed in this way, it is possible to achieve both the lowering of phase noise at the time of actual measurement of the radar, and the shortening of settling waiting time occurring in a section not used for the measurement of the radar. Hereinafter, a specific method using such a technique will be described.

Figure 13:
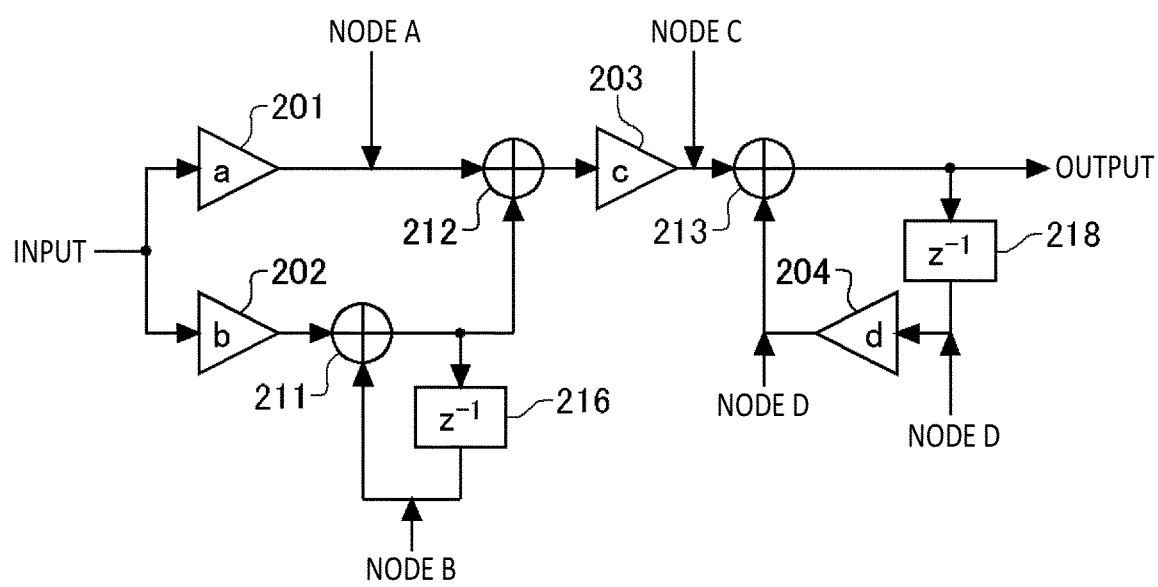
FIG. 13 is a block diagram illustrating an example of a configuration of a digital loop filter 200A.

FIG. 13 is a block diagram illustrating an example of a configuration of the digital loop filter 200A. The digital loop filter 200A includes amplifiers 201, 202, 203, and 204 and adders 211, 212, and 213.

The signal input to the digital loop filter 200A is amplified by the amplifier 201 having an amplification factor a and an amplifier 202 having an amplification factor b. The output of the amplifier 202 is input to the adder 211, the output of the adder 211 is stored in a first delay circuit 216 such as a flip-flop, and is input to the adder 211 with a delay of one clock of the operation clock.

In addition, the adder 212 adds the output of the adder 211 and the output of the amplifier 201. The input of the digital loop filter 200A to the output of the adder 212 serve as the functionality of an integrator including a zero point. The output of the adder 212 is amplified by an amplifier having an amplification factor c and input to the adder 213.

The output of the adder 213 is stored by a second delay circuit 218 such as a second flip-flop, and is input to the amplifier 204 having an amplification factor d with a delay of one clock of the operation clock, and the output is input to the adder 213. The output of the adder 213 directly becomes the output of the digital loop filter 200A.

The portion after the amplifier 203 serves as a low-pass filter. The parameter of the loop band is set by a combination of the respective amplification factors a, b, c, and d of the amplifiers 201, 202, 203, 204 in the digital loop filter 200A.

Figure 14:
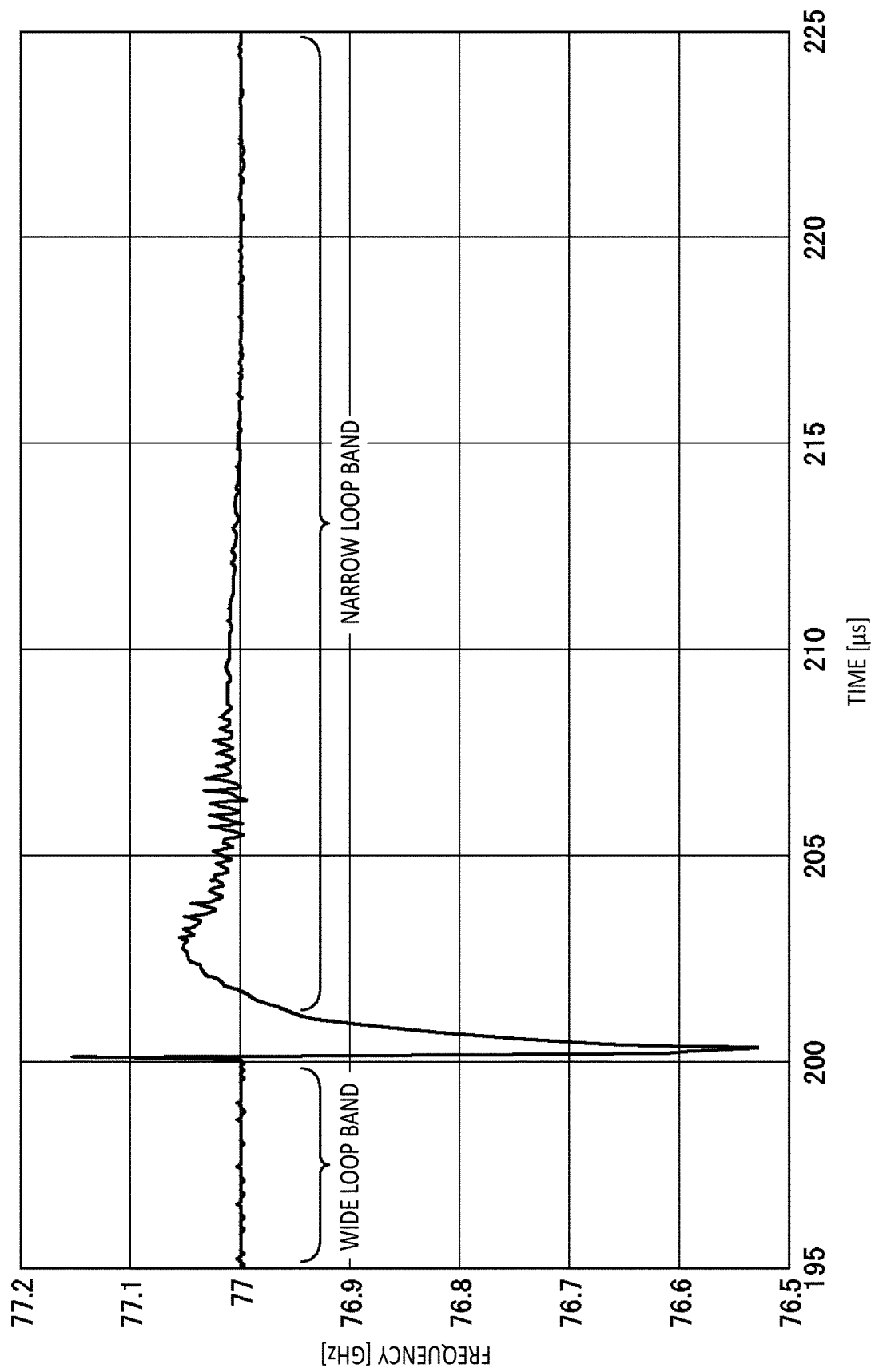
FIG. 14 illustrates a simulation result of a frequency behavior when the loop band is switched using the digital loop filter 200A according to FIG. 13.

FIG. 14 illustrates a simulation result of a frequency behavior when the loop band is switched using the digital loop filter 200A according to FIG. 13. In the drawing, in a state where the PLL circuit converges to a certain specific frequency, a case where the loop band is set to be wide until time 200 µs and the loop band is changed at time 200 µs to be set to be narrow is simulated. As shown in the simulation result, simply switching the amplification factors a, b, c, and d to change the loop band setting results in a large frequency deviation at the moment of switching. Hereinafter, the cause of this will be described.

In a state where the frequency has converged, the input of the digital loop filter 200A ideally becomes zero, and the output becomes a certain constant value. That is, the value is zero at a node A in FIG. 13, and is a constant value at nodes B, C, and D. Here, when the values of the parameters c and d which determine the band of the loop change, the values of the node C and the node D' change. Therefore, the value of the output also greatly changes in accordance with the parameter change, and the frequency may change. Thereafter, by the closed loop of the PLL circuit, the value gradually converges to a value without deviation, and the output becomes the same value as the initial value.

Figure 15:
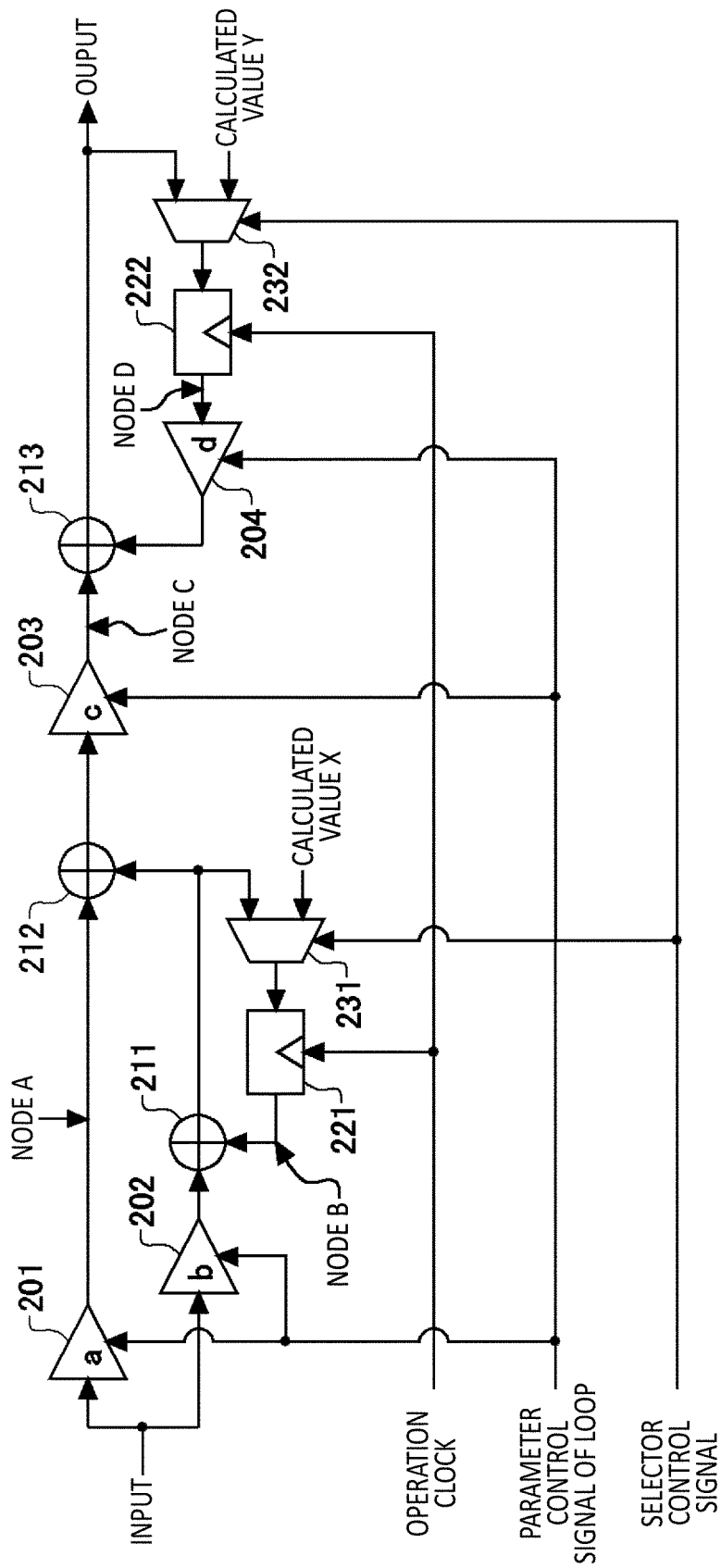
FIG. 15 is a block diagram illustrating an example of a configuration of a digital loop filter 200B.

As described above, simply changing the parameter of the loop filter which determines the loop band may cause a change in frequency immediately after switching, and high-speed switching as intended cannot be realized. As a method for solving the problem, a configuration of the digital loop filter 200B as illustrated in FIG. 15 can be considered. The digital loop filter 200B includes flip-flops 221 and 222 and selectors 231 and 232 in addition to a similar configuration to that of the digital loop filter 200, that is, the amplifiers 201, 202, 203, and 204 and the adders 211, 212, and 213.

Accordingly, the digital loop filter 200B according to FIG. 15 can switch the inputs to the flip-flops 221 and 222 by a selector control signal. The amplification factors a, b, c, and d, which are the constants of the digital loop filter, of the amplifiers 201, 202, 203, and 204 can be changed according to the parameter control signal of the loop.

In this configuration, when the parameters of the loop filter are switched, in accordance with the parameter change, the values to be stored in the flip-flops 221 and 222 are switched between the selectors 231 and 232, respectively, and calculated values X and Y are stored in the flip-flops 221 and 222. Here, for example, when the parameters before the change of the loop band are denoted as $c_{before}$ and $d_{before}$, and the parameters after the change are denoted as $c_{after}$ and dafter, the calculated values X and Y are values based on the following calculation expressions.

$$X = B \cdot \frac{c_{after}}{c_{before}} \quad (7)$$

$$Y = D \cdot \frac{d_{after}}{d_{before}} \quad (8)$$

In the expressions, B and D are values of the node B and the node D, respectively.

The amplifier 201 amplifies the signal output from the detection unit at the amplification factor a. The amplifier 201 is an example of a "first amplifier", and the amplification factor a corresponds to a "first amplification factor".

The amplifier 202 amplifies the signal output from the detection unit at the amplification factor b. The amplifier 202 is an example of a "second amplifier", and the amplification factor b corresponds to a "second amplification factor".

The output of the amplifier 202 is input to the adder 211. The adder 211 is an example of a "first adder".

The output of the adder 211 and the output of the amplifier 201 are input to the adder 212. The adder 212 is an example of a "second adder".

The flip-flop 221 outputs the calculated value X or the output of the adder 211 to the adder 211 based on the operation clock and the output of the selector 231. When the flip-flop 221 outputs the output of the adder 211, the output based on the operation clock is performed, and thus the flip-flop 221 delays the output of the adder 211 by one clock and inputs the delayed output to the adder 211. The flip-flop 221 is an example of a "first delay circuit".

The amplifier 203 amplifies the output of the adder 212 at the amplification factor c. The amplifier 203 is an example of a "third amplifier", and the amplification factor c corresponds to a "third amplification factor".

The output of the amplifier 203 is input to the adder 213. The adder 213 is an example of a "third adder".

The flip-flop 222 outputs the calculated value Y or the output of the adder 213 to the amplifier 204 based on the operation clock and the output of the selector 232. When the flip-flop 222 outputs the output of the adder 213, the output based on the operation clock is performed, and thus the flip-flop 222 delays the output of the adder 213 by one clock and inputs the delayed output to the amplifier 204. The flip-flop 222 is an example of a "second delay circuit".

The amplifier 204 amplifies the output of the flip-flop 222 at the amplification factor d. The amplifier 204 is an example of a "fourth amplifier", and the amplification factor d corresponds to a "fourth amplification factor".

The control unit 150 (not illustrated) connected to the digital loop filter 200B of the present embodiment emits the selector control signal and the parameter control signal of the loop. By switching the amplification factors a, b, c, and d, the control unit 150 can switch the loop band of the digital loop filter 200B between the first bandwidth in the period until the settling waiting time occurring immediately after the start of the chirp operation is completed and the second bandwidth in the chirp operation period used as the measurement of the radar.

The output of the adder 211 and the calculated value X are input to the selector 231, and the selector 231 outputs one of the output of the adder 211 or the calculated value X to the flip-flop 221. The calculated value X is an example of a "first calculated value", and the selector 231 is an example of a "first selector".

The output of the adder 213 and the calculated value Y are input to the selector 232, and the selector 232 outputs one of the output of the adder 213 or the calculated value Y to the flip-flop 222. The calculated value Y is an example of a "second calculated value", and the selector 232 is an example of a "second selector".

Figure 16:
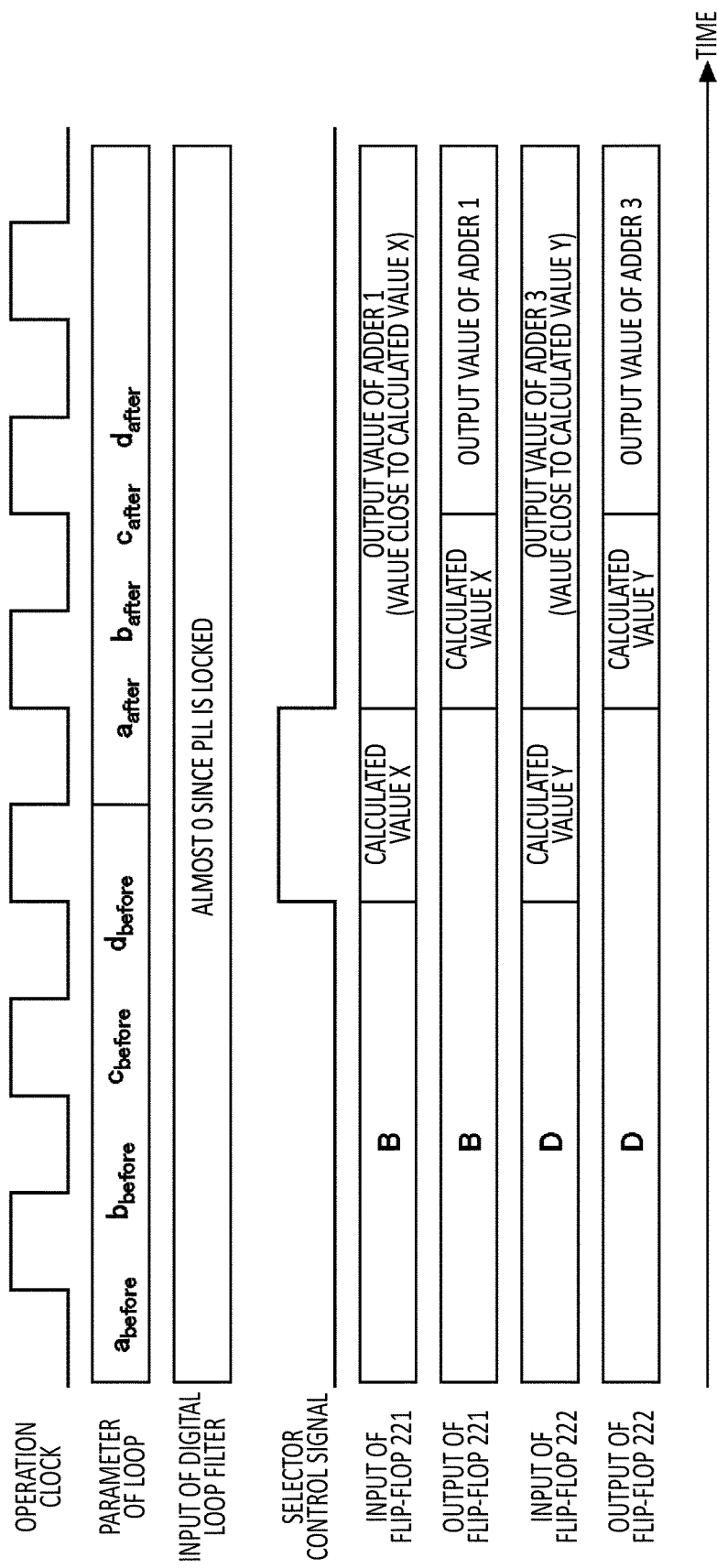
FIG. 16 is a diagram illustrating a timing relationship of the operation of the digital loop filter 200B.

FIG. 16 is a diagram illustrating a timing relationship of the operation of the digital loop filter 200B. The inputs of the flip-flops 221 and 222 are switched to the calculated values X and Y immediately before the parameters of the amplifiers 201 to 204 are changed, the calculated values X and Y are immediately stored in the flip-flops 221 and 222 when the parameter is changed, and the inputs of the flip-flops 221 and 222 return back to the output of the adder 211 and the output of the adder 213 which are normal input values.

Therefore, the control unit 150 causes the selector 231 to output the calculated value X and causes the selector 232 to output the calculated value Y from a predetermined previous period before the timing of switching the amplification factors a, b, c, and d to a predetermined subsequent period after the switching timing. The control unit 150 further causes the selector 231 to output the output of the adder 211 and causes the selector 232 to output the output of the adder 213 in a period other than the predetermined previous period and the predetermined subsequent period.

The calculated value X satisfies Expression 7, and the calculated value Y satisfies Expression 8. Therefore, the calculated value X and the calculated value Y are determined based on the amplification factor $c_{before}$ and the amplification factor $d_{before}$ before switching and the amplification factors $c_{after}$ and the amplification factor dafter after switching.

Figure 17:
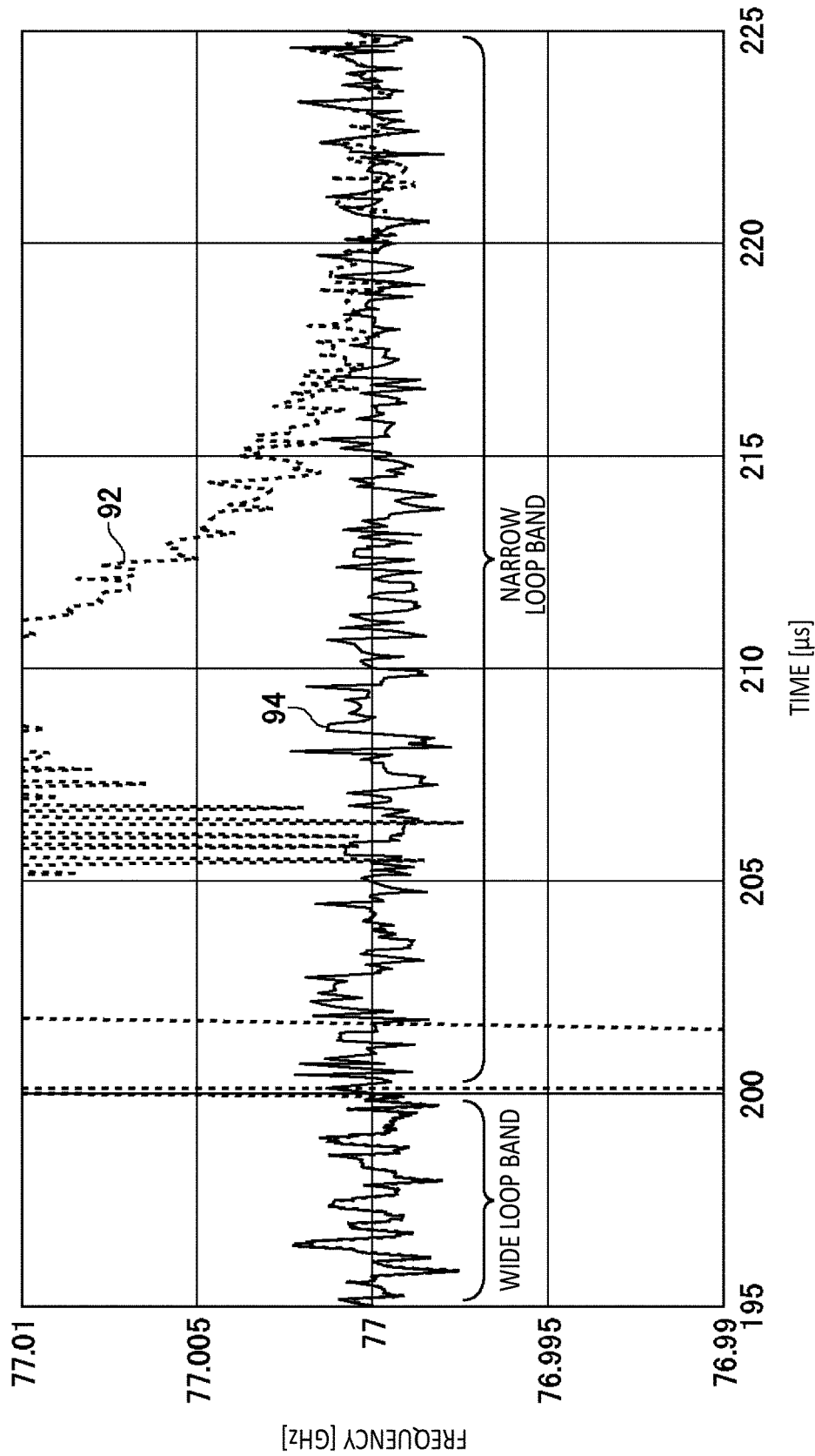
FIG. 17 illustrates simulation results when the operations of the digital loop filter 200A and the digital loop filter 200B are applied.

FIG. 17 illustrates simulation results of the operations of the digital loop filter 200A and the digital loop filter 200B. A case indicated by a broken line 92 in the drawing is a case where band switching is performed by the digital loop filter 200A illustrated in FIG. 13 without performing switching by the selector. A solid line 94 in the drawing indicates the case of the configuration of the digital loop filter 200B illustrated in FIG. 15 in which switching is performed by the selector.

As is apparent from the result of FIG. 17, by adopting a configuration in which the write values to the flip-flops 221 and 222 are switched by the selector at the time of band switching, the frequency deviation does not occur even at the time of band switching, and the band switching is smoothly performed. Accordingly, the loop band of the PLL circuit can be switched smoothly during the chirp operation used for radar measurement and in another section. The smooth band switching can be easily realized since the digital PLL circuit can realize stable performance regardless of a temperature, a power supply voltage, or a manufacturing process, and various errors may have an impact in the analog PLL circuit in which the loop filter is constituted by an analog circuit.

Next, the entire operation in the configuration of the PLL circuit 20A illustrated in FIG. 10 will be described with reference to FIG. 18. The operation of the PLL circuit 20A is mainly divided into the calibration operation and the modulation operation.

Figure 19:
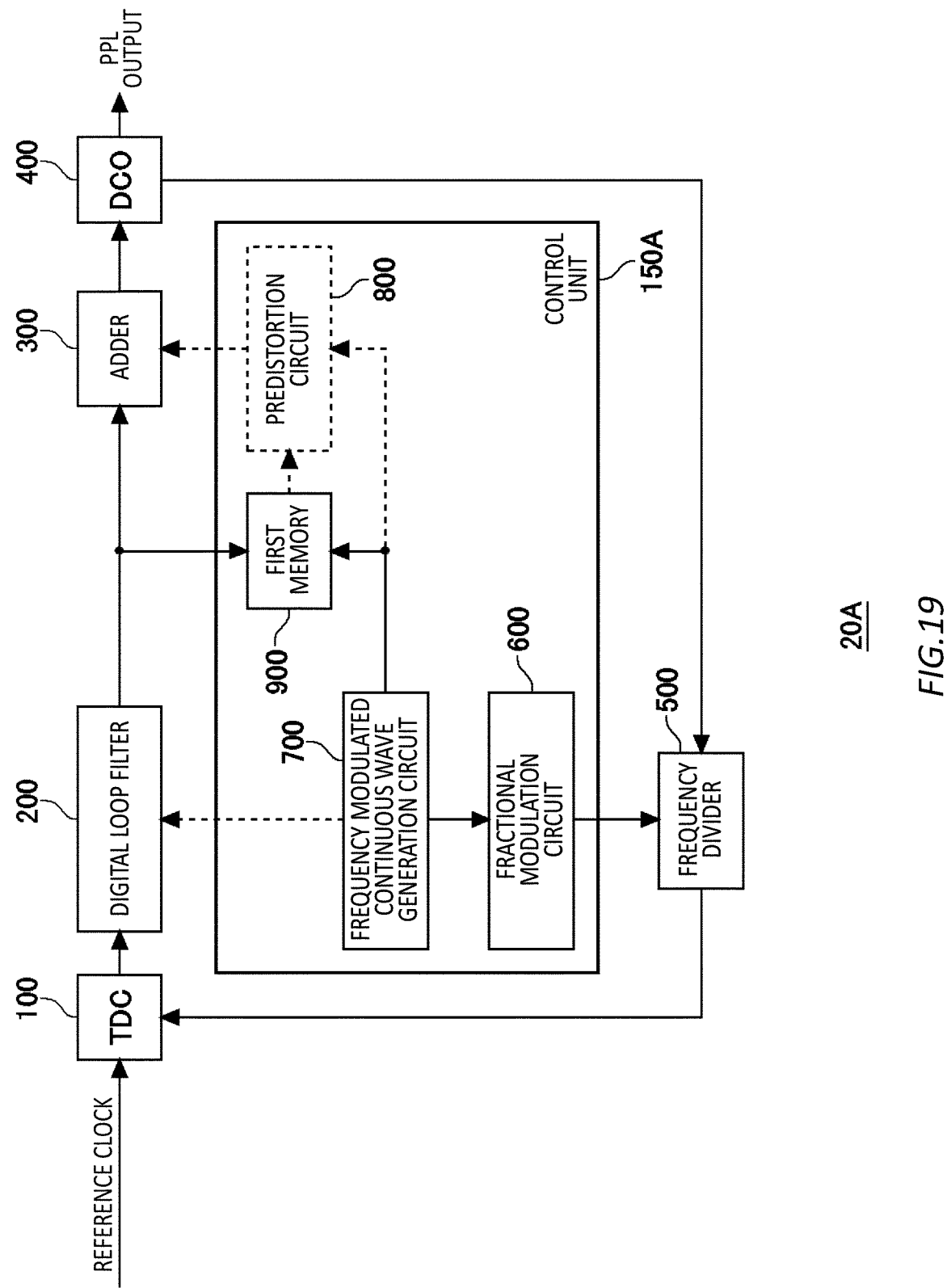
FIG. 19 illustrates an example of blocks operating during a calibration operation.

FIG. 19 illustrates an example of blocks operating during the calibration operation. In the calibration operation, the predistortion circuit 800 stops the operation. Therefore, the adder 300 does not perform an addition operation, and the input from the digital loop filter 200 is output as it is.

In the calibration operation, the frequency of the PLL circuit 20A is set, and the value of the digital loop filter 200 is stored in the first memory 900 after waiting for the stabilization time until the frequency of the PLL circuit 20A converges. The operation is performed at several frequencies, and a correspondence table of the convergence value of the digital loop filter 200 for the discretely selected frequency is stored in the first memory 900.

Figure 18:
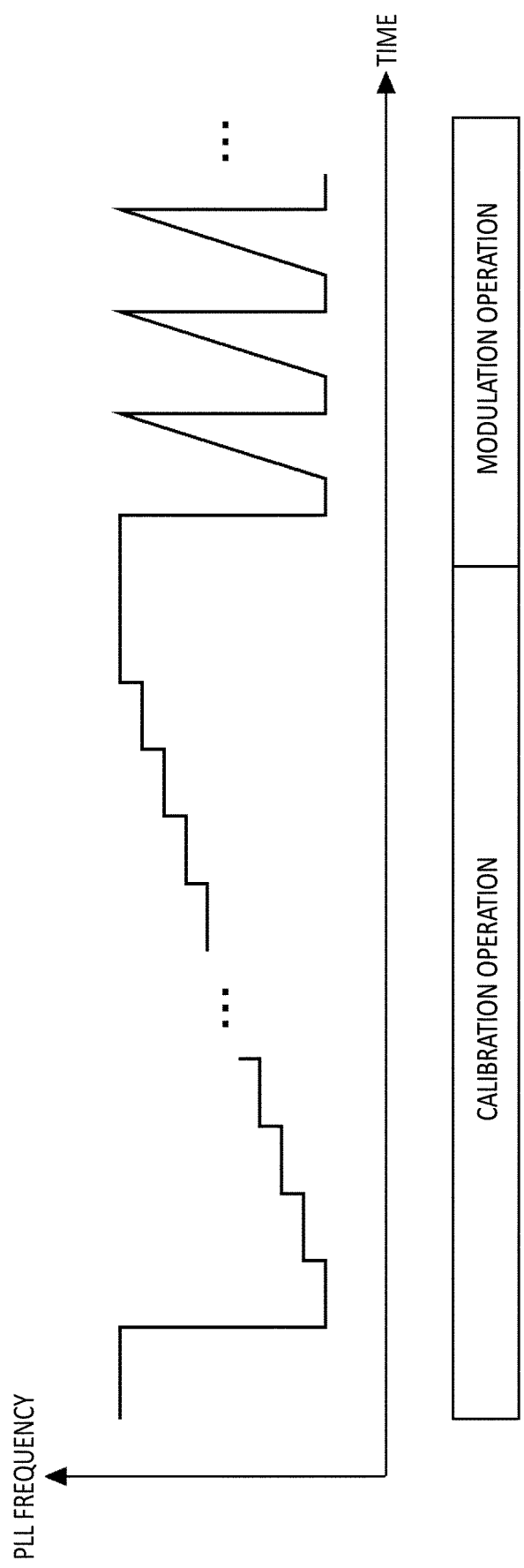
FIG. 18 is a diagram for explaining the entire operation in the configuration of the PLL circuit 20A illustrated in FIG. 10.
Figure 20:
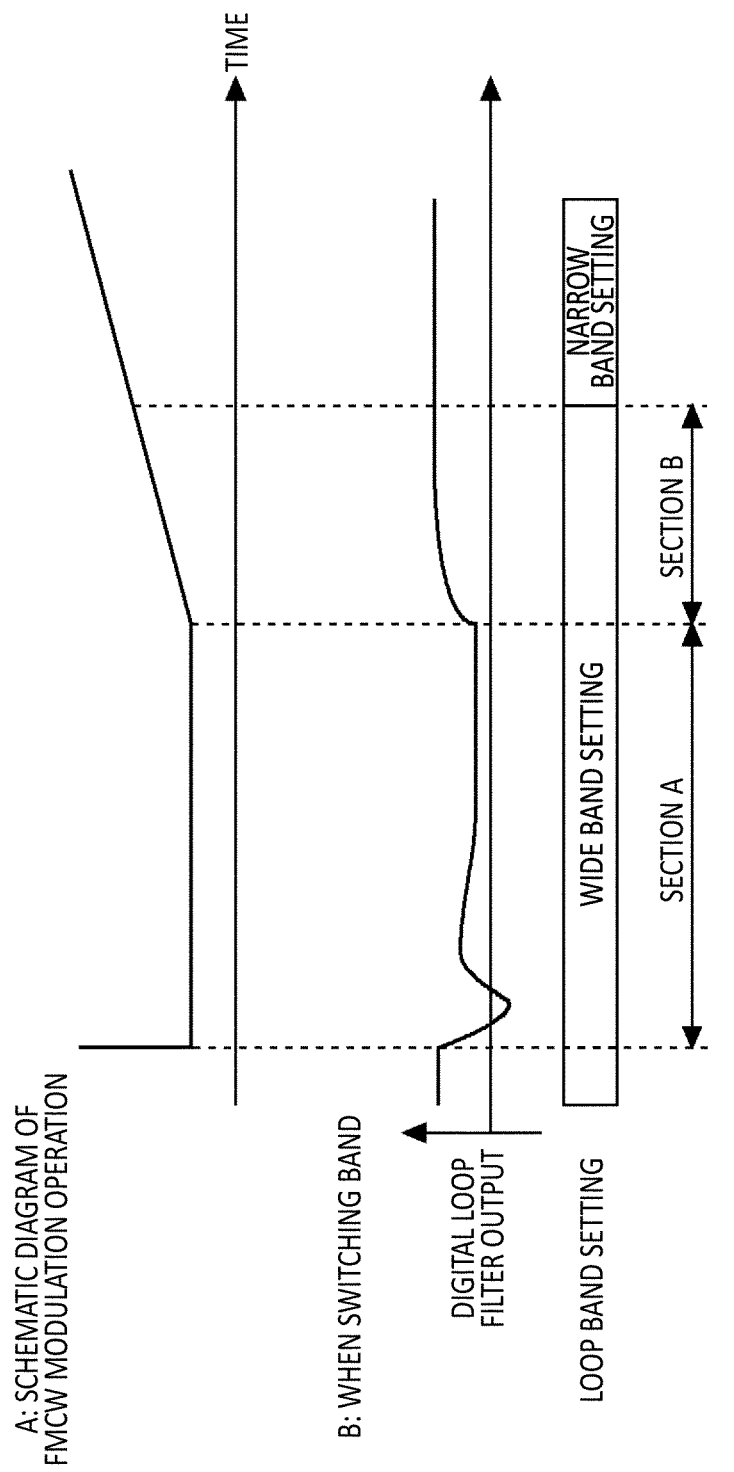
FIG. 20 is a diagram schematically illustrating a response of the digital loop filter 200 when the above-described loop band switching operation is performed in the modulation operation of FIG. 18.

FIG. 20 is a diagram schematically illustrating a response of the digital loop filter 200 when the above-described loop band switching operation is performed in the modulation operation of FIG. 18. A of FIG. 20 illustrates a change in frequency in the FMCW modulation. B of FIG. 20 illustrates the output of the digital loop filter 200 and the loop band setting at that time.

A frequency error occurs when the frequency is returned in the FMCW modulation. Since the band of the loop is set to wide band setting in the time of a section A from error occurrence to the start of the chirp operation, settling is performed at a higher speed than that in narrow band setting. Therefore, the time of the section A can be shortened.

In addition, an error in the FMCW modulation also occurs by transition to the first-order lag system when the chirp operation starts. A section B corresponding to the settling time can also be made shorter than a case where the band of the loop is set to the narrow band setting. When the band setting of the loop in a state where the error is sufficiently settled is changed from the wide band setting to the narrow band setting by the method described above, for example, the waiting time of the section not used as the radar can be shortened. On the other hand, the section used as the radar can be set to the narrow band setting having excellent phase noise characteristics. In addition, in the present embodiment, the waiting time immediately after the start of the chirp operation can be shortened, and thus the chirp modulation section which can be used for the radar can be widely used, and the frequency width effective for the measurement of the radar in the chirp operation can be widened. Further, by using the PLL circuit 20A or 20B of the present embodiment, the distance resolution of the radar can be improved.

Second Embodiment

Figure 21:
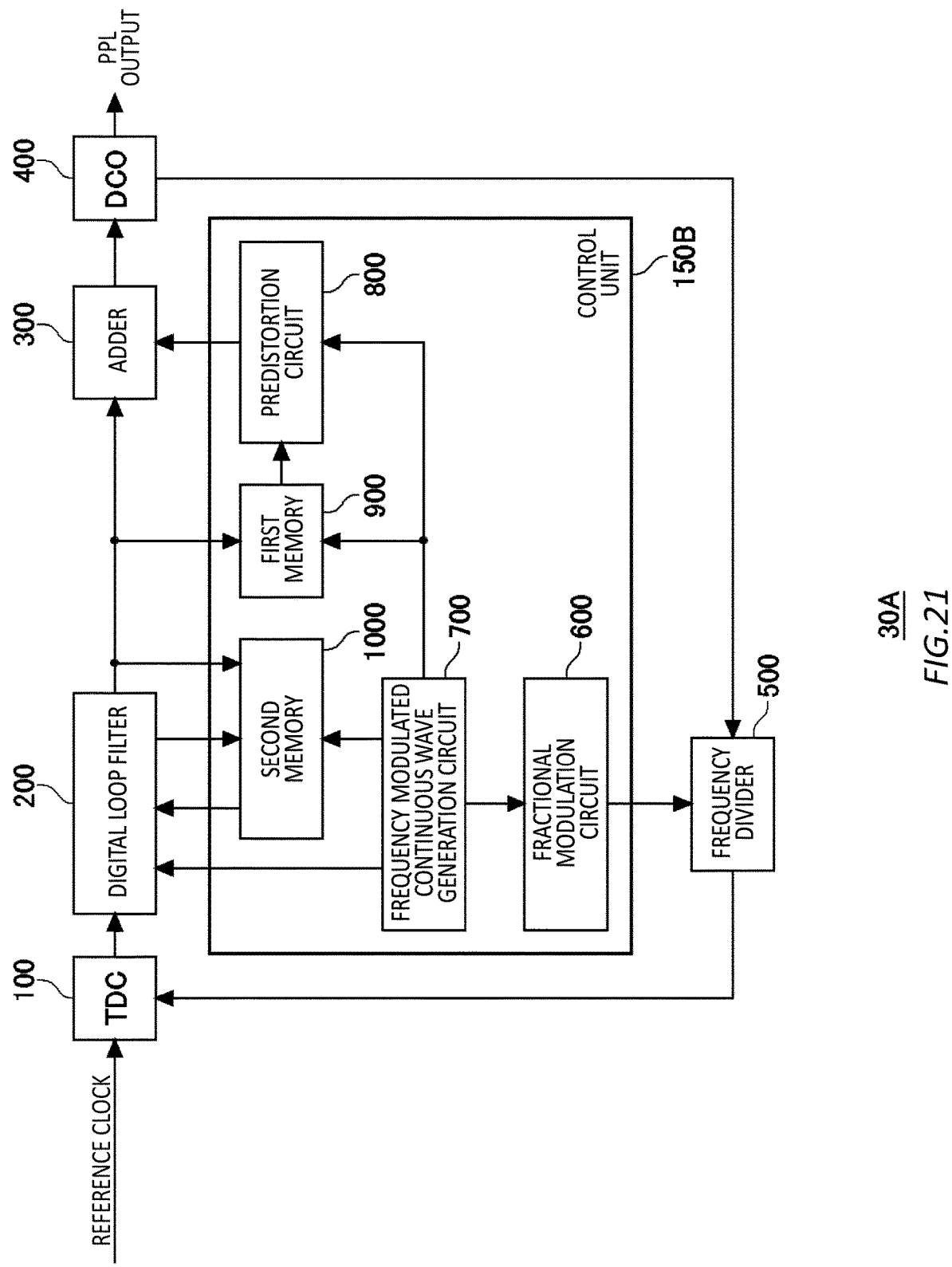
FIG. 21 is a diagram illustrating a PLL circuit 30A according to a second embodiment.

FIG. 21 is a diagram illustrating a PLL circuit 30A according to a second embodiment. Hereinafter, a description will be given focusing on a difference between the PLL circuit 20A of the first embodiment and the PLL circuit 30A of the second embodiment. In the second embodiment, a second memory 1000 is provided as the configuration of a control unit 150B in addition to the configuration of the PLL circuit 20A described in the first embodiment.

The second memory 1000 uses, as inputs, the output of the digital loop filter 200 and the value of the appropriate internal node of the digital loop filter 200, and outputs, to the digital loop filter 200, the value stored according to the timing control signal from the frequency modulated continuous wave generation circuit 700 or a result calculated from the stored value. In addition, the frequency modulated continuous wave generation circuit 700 outputs information regarding the timing and state of the FMCW operation to the second memory 1000.

Although not illustrated in FIG. 21, similarly to the description in the first embodiment, the PLL circuit 30A may include, between the TDC 100 and the digital loop filter 200, the modulation compensation circuit 62 for canceling the quantization error delta-sigma modulated by the fractional modulation operation, for example.

In addition, the PLL circuit 30A may include the PFD circuit 52 which performs frequency phase comparison before the TDC 100, for example. The reference clock and the output of the frequency divider 500 may be input to the PFD circuit 52. The PFD circuit 52 may generate a pulse corresponding to a difference in timing between the reference clock and the frequency-divided signal of the frequency divider 500. The TDC 100 may be configured to detect the pulse width of the pulse output from the PFD circuit 52.

In addition, the PLL circuit 30A may include an arithmetic circuit such as the digital charge pump circuit 102 between the TDC 100 and the digital loop filter 200 according to the format of the value output from the TDC 100. As the format of the value output from the TDC 100, for example, only the absolute value of the difference in timing between the reference clock and the frequency-divided signal of the frequency divider 500 may be output as the value output from the TDC 100.

In this case, additionally, the PFD circuit 52 may sense the timing of whether the reference clock or the signal frequency-divided by the frequency divider 500 is input first. Depending on whether the output value of the TDC 100 is positive or negative, the digital charge pump circuit 102 may output the value with the sign of the value reversed. Note that when the TDC 100 outputs a positive or negative value according to the timing order of the reference clock and the frequency divider 500, the digital charge pump circuit 102 may be omitted.

Figure 22:
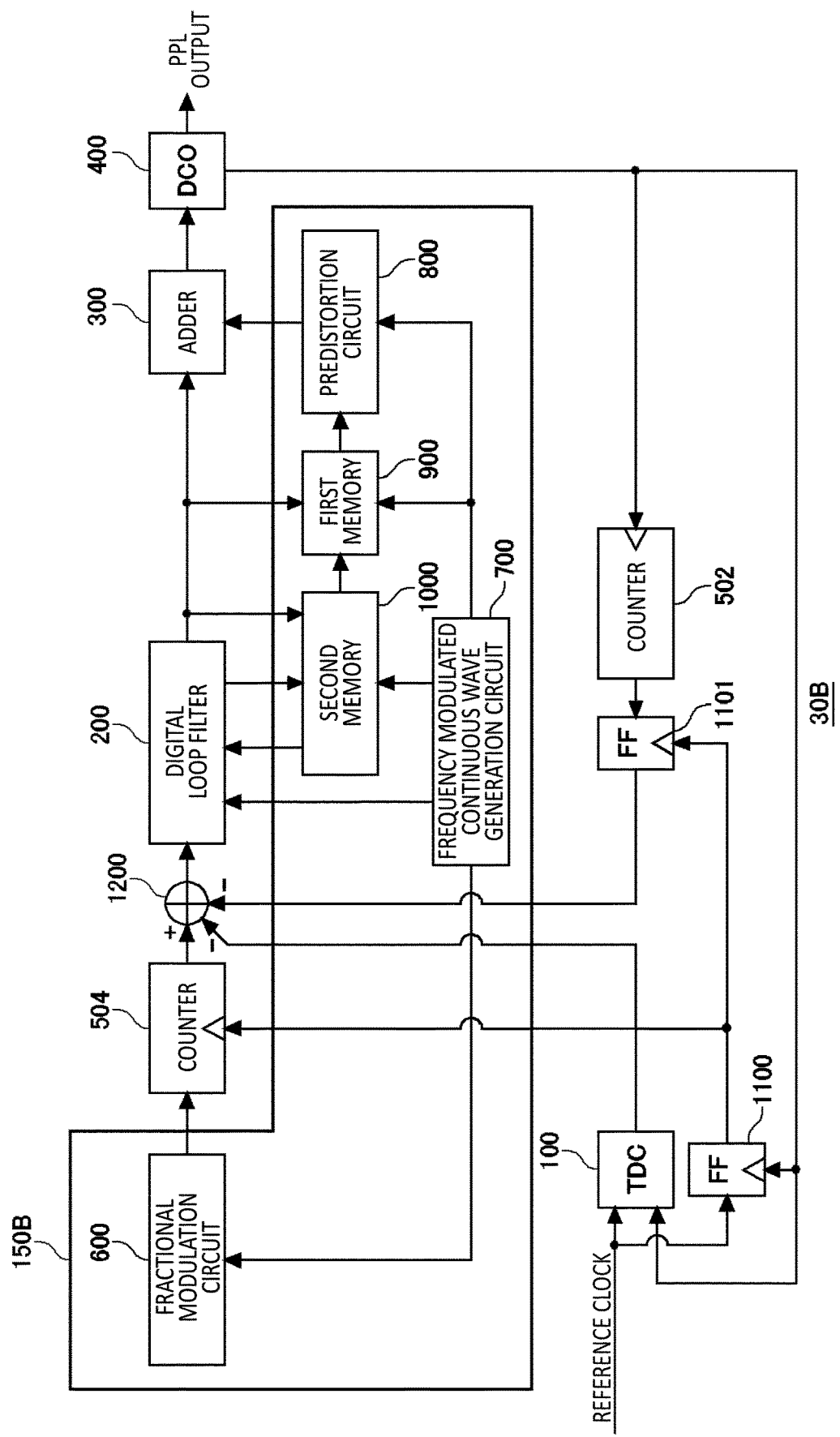
FIG. 22 is a diagram illustrating a PLL circuit 30B according to another example of the second embodiment.

The configuration of the PLL circuit 30A has been described with reference to FIG. 19. Here, the PLL circuit 30B may have a configuration using the TDC 100, the counters 502 and 504, the adder 1200, and the flip-flops 1100 and 1101 as illustrated in FIG. 22. This configuration is obtained when the configuration described in FIG. 4 is applied to the present embodiment.

In the first embodiment, a method of shortening the settling waiting time in the FMCW modulation by dynamically switching the loop band has been described. The speed of settling is determined by the loop band design, but there may be an upper limit on widening the loop band and making settling faster. Therefore, when the dynamic switching of the loop band described in the first embodiment is performed, the settling time becomes a constraint in the parameter for a widened loop band, and the repetition speed of the FMCW modulation or the reduction of the settling waiting time immediately after the start of the chirp operation may be limited. A behavior when the loop band is switched without sufficiently waiting for the settling time immediately after the start of the chirp operation in a case where the loop band is dynamically switched as described above will be described with reference to FIG. 23.

Figure 23:
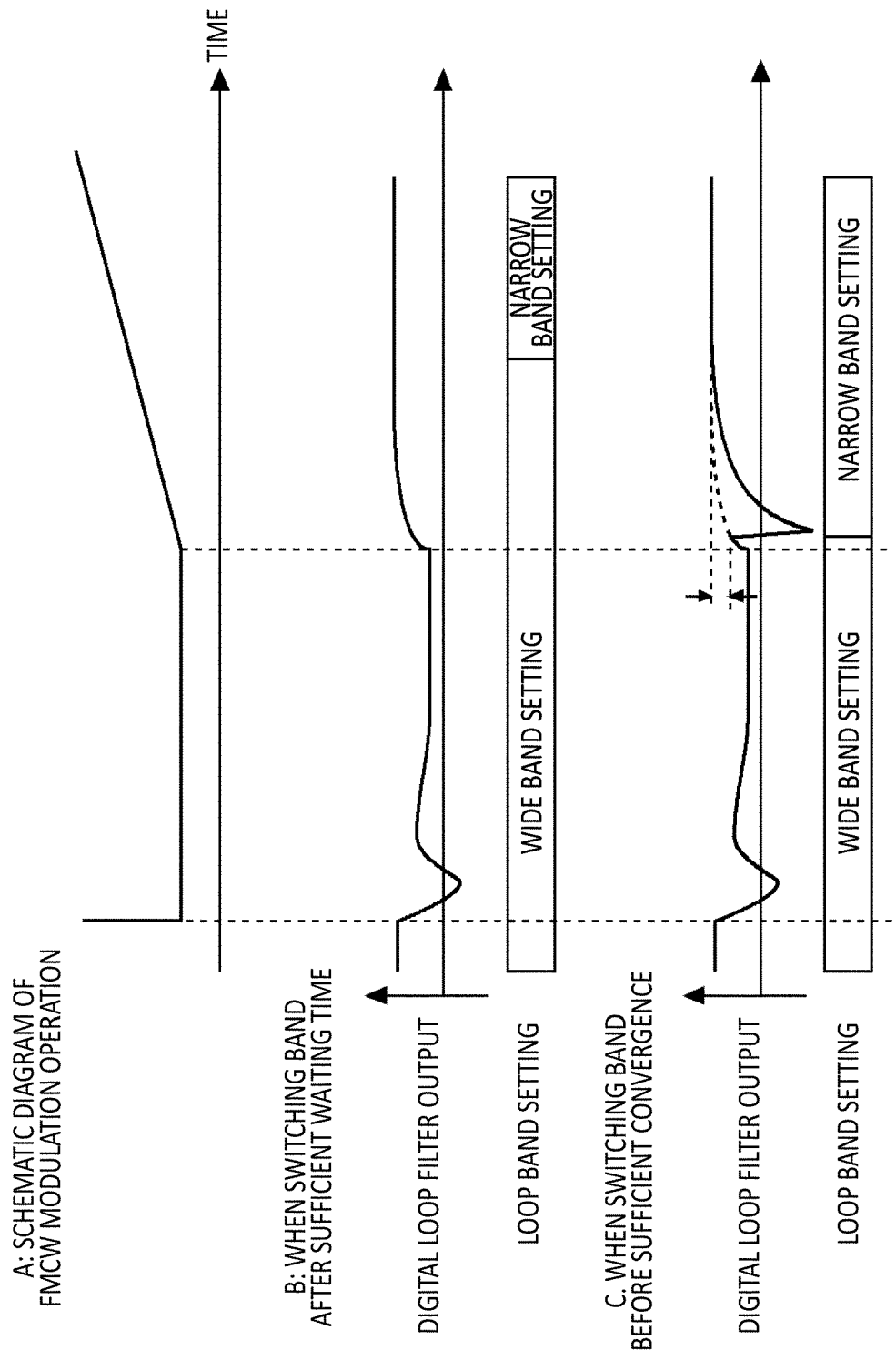
FIG. 23 is a schematic diagram of a frequency response at the start of a chirp operation and an output value of the digital loop filter 200 in an FMCW operation.

A of FIG. 23 illustrates a schematic diagram of the frequency response at the start of the chirp operation in the FMCW operation. B of FIG. 23 is a schematic diagram of the output value of the digital loop filter 200 corresponding to the section of A of FIG. 23. B of FIG. 23 illustrates a case where the switching of the loop band is performed after the error occurring immediately after the start of the chirp operation is sufficiently settled.

In the example of B of FIG. 23, in the output value of the digital loop filter 200, the band switching is performed after the error occurring at the time of being changed to the first-order lag system due to the chirp operation becomes sufficiently small, and thus, similarly to the case of the band switching at the constant frequency described above, the frequency jump due to the switching does not occur, and the band switching is performed smoothly.

Similarly, C of FIG. 23 illustrates a schematic diagram of the output value of the digital loop filter 200 corresponding to the section of A of FIG. 23. C of FIG. 23 illustrates a case where the switching of the loop band is performed before the error occurring immediately after the start of the chirp operation is sufficiently settled.

In the example of C of FIG. 23, the output value of the digital loop filter 200 deviates from the convergence value to be obtained during the chirp operation, and thus, the calculated value obtained at the time of switching the loop band is not the convergence value, which is the original ideal value, during the chirp operation, but is a value including an error. Therefore, an error is also included in the calculation result obtained at the time of switching the loop band, the value of the digital loop filter 200 is discontinuously scattered at the time of switching the loop band, and a frequency error occurs. Therefore, when the error is caused to converge by the response of the closed loop with the narrow loop band, the settling waiting time until the error becomes equal to or less than an allowed frequency error may be longer than that in a case where switching is not performed.

Figure 24A:
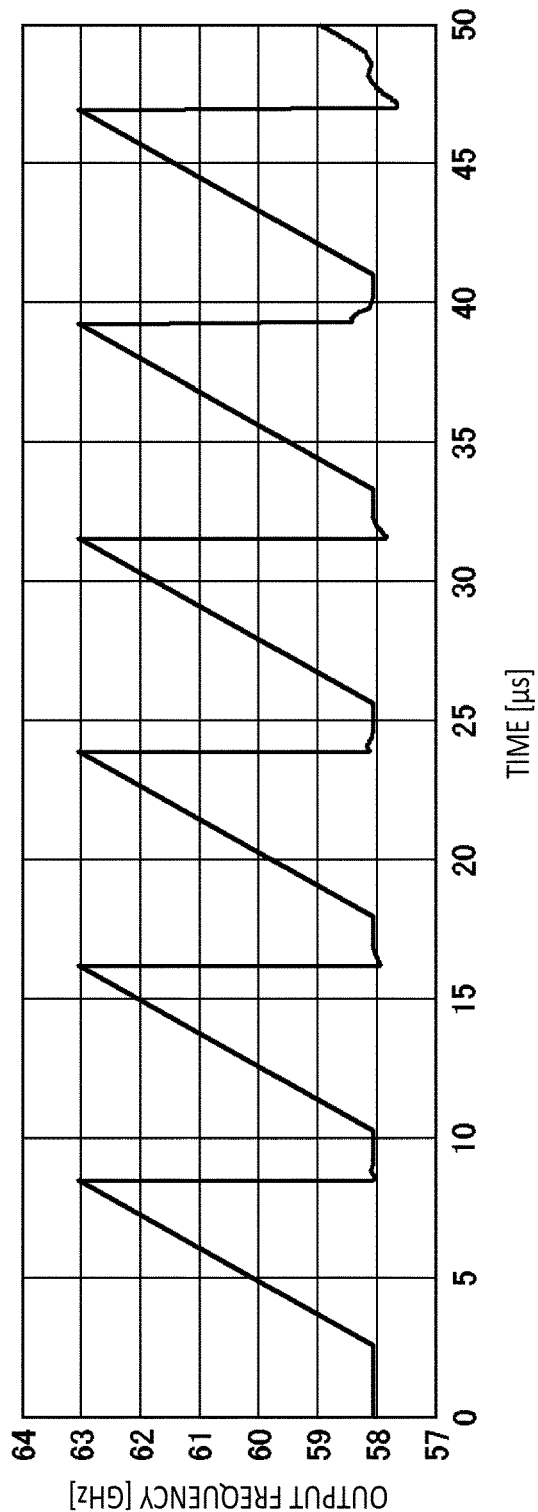
FIG. 24A illustrates a simulation result of the chirp operation of the PLL circuit 20A or the PLL circuit 20B when the loop band switching operation described in the first embodiment is applied, and the FMCW operation is made extremely fast.
Figure 24B:
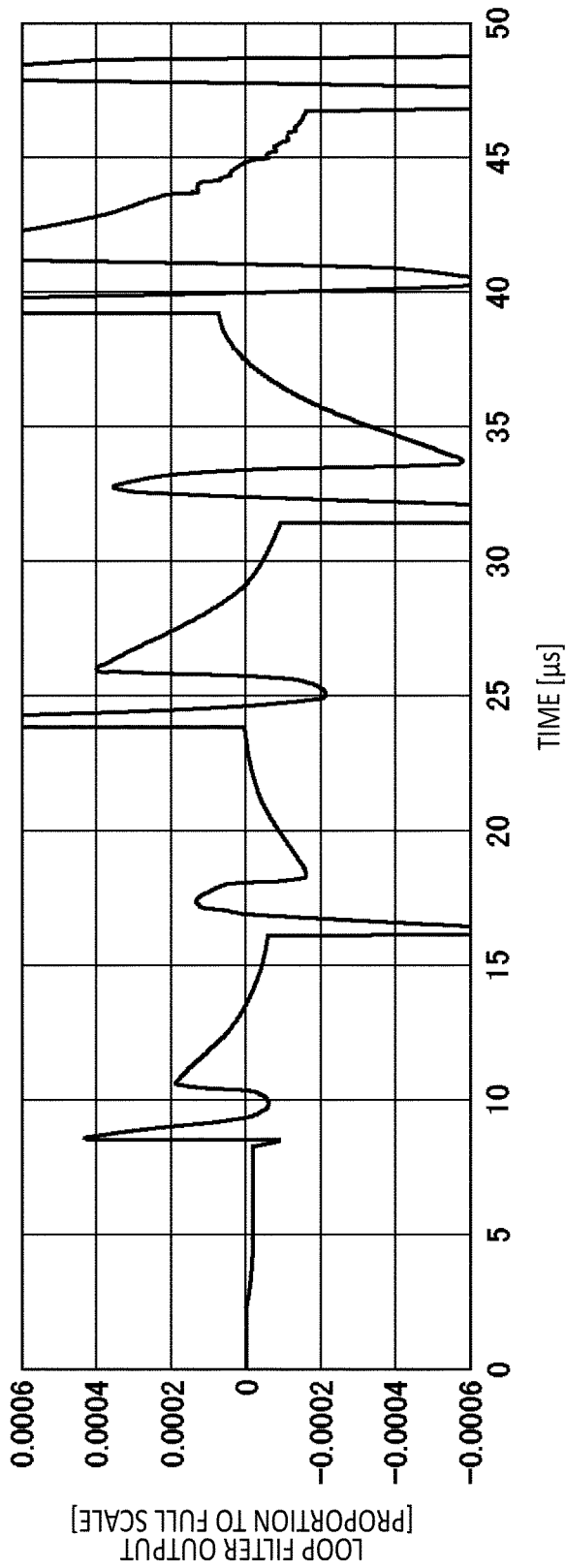
FIG. 24B illustrates a simulation result of the output of the digital loop filter 200 in the operation of FIG. 24A.

FIG. 24A illustrates a simulation result of the chirp operation of the PLL circuit 20A or the PLL circuit 20B when the loop band switching operation described in the first embodiment is applied, and the FMCW operation is made extremely fast. FIG. 24B illustrates a simulation result of the output of the digital loop filter 200 in the operation of FIG. 24A.

The PLL circuit 20A or the PLL circuit 20B starts to cause the error occurring due to the first-order lag system immediately after the start of the chirp operation to converge by the closed loop. However, when the band switching is performed before the settling is completed, in the PLL circuit 20A or the PLL circuit 20B, the calculation result may have an error, and the output value of the digital loop filter 200 may jump greatly.

Further, since the loop band is narrow and the settling is slow during the chirp operation, the chirp operation may end before the settling is completed during the chirp operation section. When switching from the narrow loop band to the wide loop band is performed after the end of the chirp operation and settling is not completed even after the switching, the calculation result is further deviated, and the output value of the digital loop filter 200 may jump greatly.

In such a case, even when the loop band is set to be wide, the next chirp operation is started before the error converges, and the band switching is performed again. As a result, the error of the value used for calculation becomes larger than the previous error, the calculation result has a larger error, and the output value of the digital loop filter 200 jumps more greatly. In such a case where the FMCW modulation operation is extremely fast, the loop band switching operation is performed one after another before the error is settled, and the error may be amplified each time.

Hereinafter, the operation of the PLL circuit 30A or the PLL circuit 30B of the second embodiment will be described in detail. Also in the second embodiment, similarly to the first embodiment, the PLL circuit 30A or the PLL circuit 30B performs the calibration operation and the modulation operation as illustrated in FIG. 18.

Figure 25:
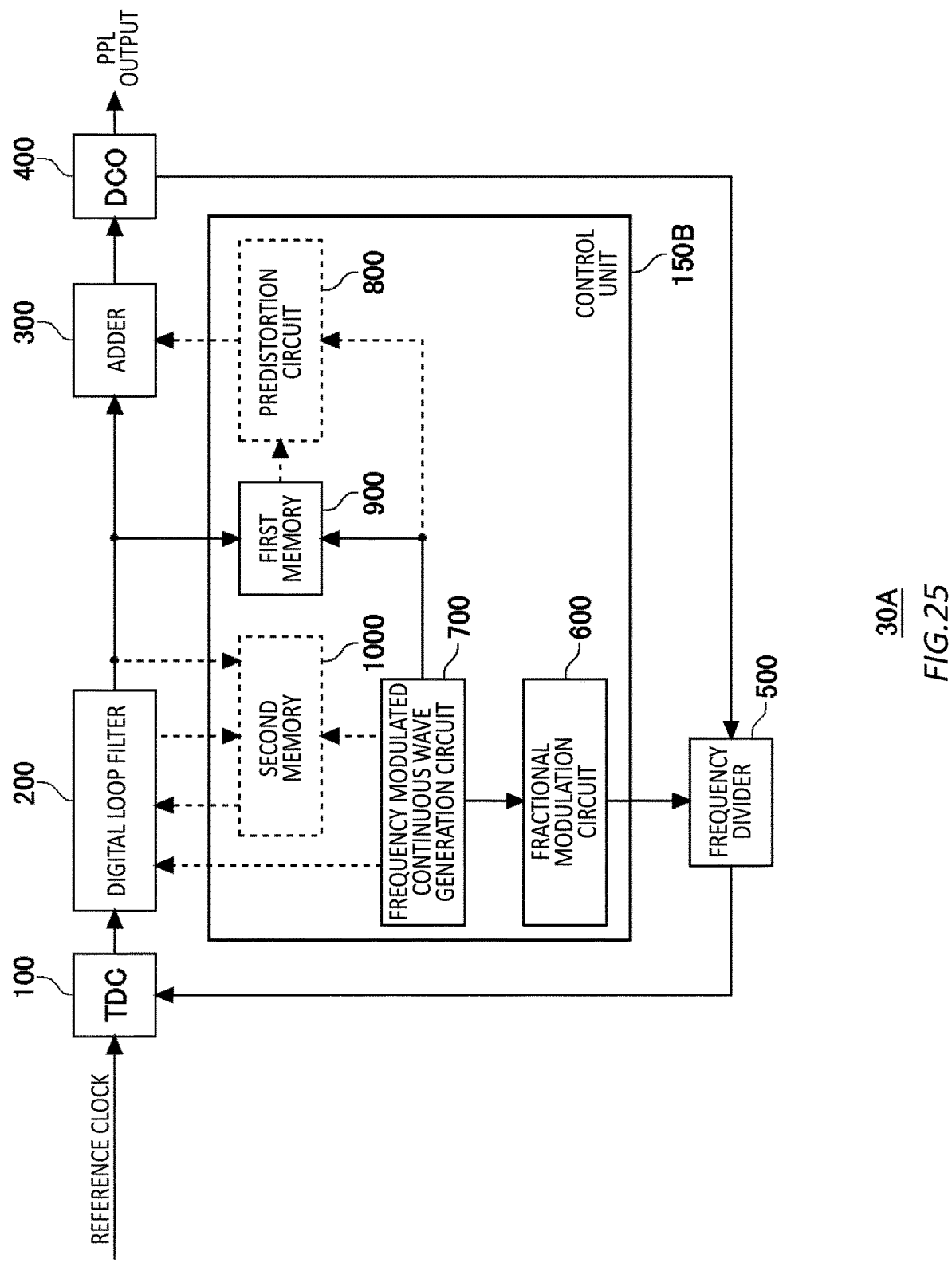
FIG. 25 illustrates blocks operating during the calibration operation.

FIG. 25 illustrates blocks operating during the calibration operation. As illustrated in FIG. 25, in the calibration operation, the second memory 1000 and the predistortion circuit 800 stop the operation. Therefore, the adder 300 does not perform an addition operation, and the input from the digital loop filter 200 is output as it is. In the calibration operation, the frequency of the PLL circuit 30A is set, and the value of the digital loop filter 200 is stored in the first memory 900 after waiting for stabilization time until the frequency of the PLL circuit 30A converges. The operation is performed at several frequencies, and a correspondence table of the convergence value of the digital loop filter 200 for the discretely selected frequency is stored in the first memory 900.

Next, in the modulation operation, the frequency information is input from the frequency modulated continuous wave generation circuit 700 to the predistortion circuit 800, and the predistortion circuit 800 performs interpolation processing from the correspondence table of the convergence value of the digital loop filter 200 with respect to the frequency input from the first memory 900. The predistortion circuit 800 outputs a convergence prediction value of the digital loop filter 200 at the input frequency.

The adder 300 adds the convergence prediction value and the output value of the digital loop filter and inputs the result to the DCO 400. Accordingly, the most of the input value for the DCO 400 to realize a desired frequency are realized by the output of the predistortion circuit 800, and only error components such as the error of the prediction value or the following error occurring due to becoming the first-order lag system during the chirp operation appear in the output of the digital loop filter 200.

Figure 26:
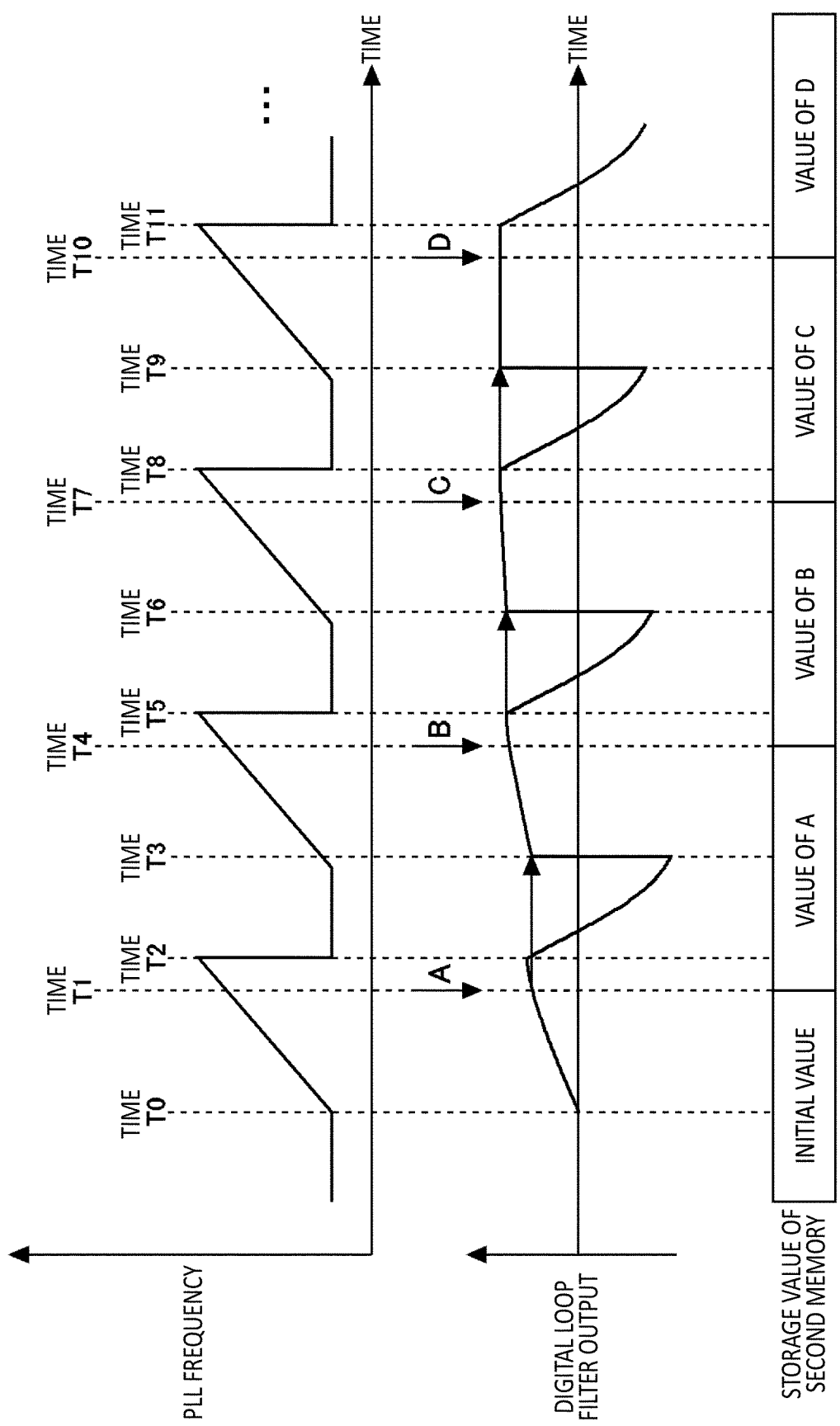
FIG. 26 is a diagram for explaining a more detailed operation of the digital loop filter 200 during a modulation operation.

Hereinafter, a more detailed operation of the digital loop filter 200 during the modulation operation will be described with reference to FIG. 26.

When the chirp operation of the FMCW modulation starts at a certain time T0, the closed loop of the PLL circuit 30A or the PLL circuit 30B becomes a first-order lag system accordingly. Accordingly, the output of the digital loop filter 200 starts to change slightly. When the chirp operation time is shorter than the settling time by the loop band of the closed loop, the settling of the output of the digital loop filter 200 is not completed even at a time T2 when the chirp operation ends. In this case, the second memory 1000 stores a value A of the digital loop filter 200 at a time T1 slightly before the time T2.

That is, the second memory 1000 stores a digital value based on the control signal output from the digital loop filter 200 in a predetermined period immediately before the end of the chirp operation period. Here, the predetermined period immediately before the end of the chirp operation period refers to, for example, a period from the time T1 to the time T2 at which the chirp operation ends. The second memory 1000 is an example of a "control signal storage unit" which functions in this manner.

At the time T2, the frequency is returned after the end of the chirp operation, and the chirp operation is started again. In this case, at a time T3 immediately after the start of the chirp operation, the output value A of the digital loop filter 200 stored in the second memory 1000 is used to write the result calculated as appropriate from a filter constant to a storage element such as a flip-flop in the digital loop filter 200, so that the output value of the digital loop filter 200 becomes A. Accordingly, the digital loop filter 200 is controlled such that the control signal output from the digital loop filter 200 immediately after the start of the chirp operation period is the previous control signal.

As described above, the control unit 150B of the second embodiment controls the digital loop filter 200 such that the control signal output from the digital loop filter 200 is the previous control signal by inputting the previous control signal from the second memory 1000, which is the control signal storage unit, to the digital loop filter 200 by time immediately after the start of the chirp operation period.

Accordingly, the settling operation which has not been completed in the previous chirp operation is restarted after the time T3, and is continued until a time T5 at which the chirp operation ends. Then, the second memory 1000 stores a value B of the digital loop filter 200 at time T4 slightly before the time T5. This value B is used at a time T6 immediately after the start of the next chirp operation.

At the time T6, the output value of the digital loop filter 200 is set to the value B, so that the settling operation is restarted, and the settling operation is continued until a time T8. By repeating such an operation for each chirp operation, the settling operation during the chirp is completed when the chirp operation is overlapped, and it is possible to achieve a state where the frequency error is suppressed immediately after the start of the chirp.

For convenience, times T1, T4, and T7, and the like have been described as times immediately before times T2, T5, and T8 at the end of the chirp operation period, but it is sufficient if this times are within the chirp operation period and after the timing at which the previous chirp result such as times T3, T6, and T9 is calculated and applied to the storage element in the loop filter. For example, in the relationship between the times T3 and T4, as the time within the same chirp operation becomes longer, the settling operation in one chirp becomes faster, and the settling operation becomes in the state of complete convergence with the elapse of a small number of chirps. However, even with short time, a similar effect is finally exhibited with the elapse of a large number of chirps.

As a result, although in the related art, the settling waiting time immediately after the start of the chirp operation needs to be sufficiently long in order to sufficiently reduce the frequency error, the frequency error caused by the first-order lag system immediately after the start of the chirp operation can be reduced even when the settling waiting time is extremely shortened. The PLL circuit 30A or the PLL circuit 30B including such a control unit 150B can widely use the chirp modulation section which can be used for radar even in a high-speed FMCW modulation, and can widen the frequency width effective for the measurement of the radar in the chirp period. Further, by using the PLL circuit 30A or the PLL circuit 30B of the present embodiment, the distance resolution of the radar can be improved.

In the above description, the value stored in the second memory 1000 is the output of the digital loop filter, but the value stored in the second memory 1000 is not limited to this example. The value stored in the second memory 1000 may be a value of the internal node of the digital loop filter 200 or may be a value of both the internal node and the output of the digital loop filter 200. Note that the control unit 150B may specify start time points T0, T3, and T6, and the like of the chirp operation period based on the timing information signal from the frequency modulated continuous wave generation circuit 700.

Figure 27:
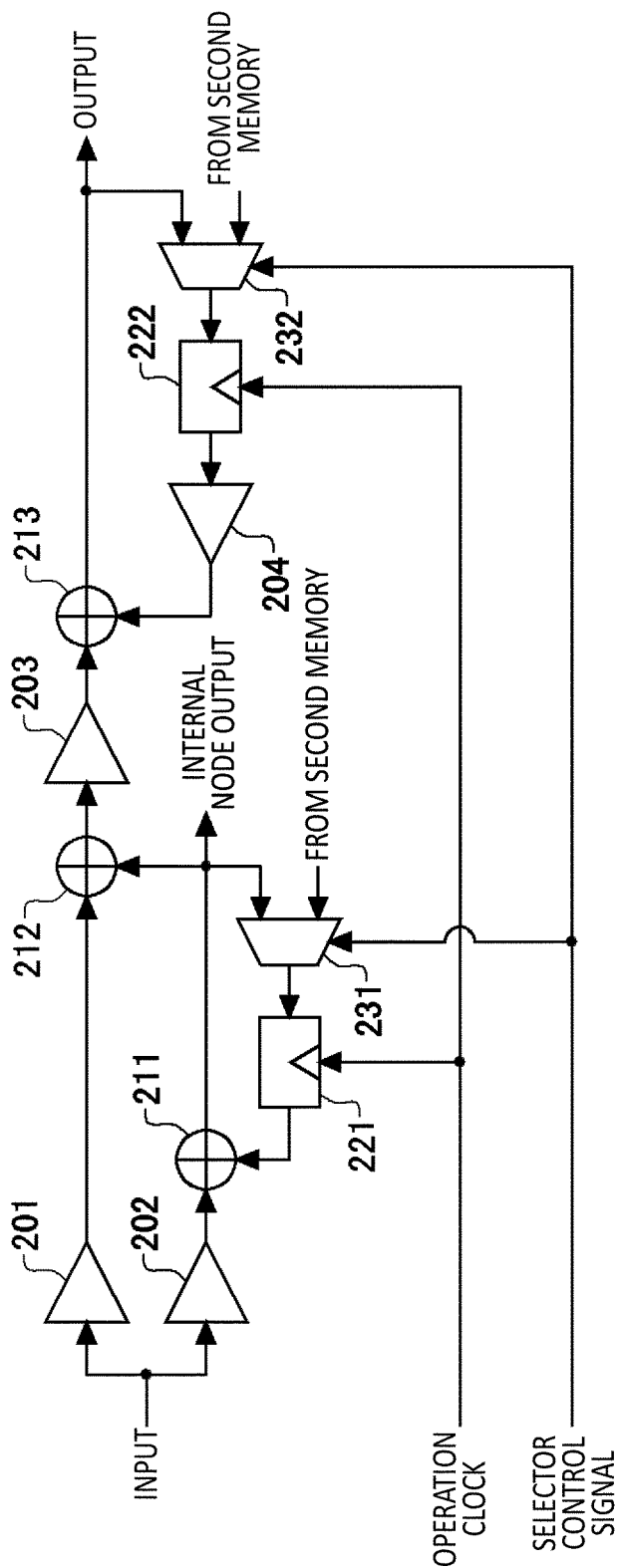
FIG. 27 illustrates an example of a digital loop filter 200C in the second embodiment.

FIG. 27 illustrates an example of a digital loop filter 200C according to the second embodiment.

The amplifiers 201 and 202 amplify the input of the digital loop filter 200C. The output of the amplifier 201 is input to one input of the adder 212. The output of the amplifier 202 is input to one input of the adder 211.

The output of the adder 211 is input as one input of the selector 231, input to another input of the adder 212, and passed as an internal node output to the second memory 1000. In addition, from the second memory 1000, the stored internal node output value is input as another input of the selector 231. The output of the selector 231 is input to the flip-flop 221 which operates as a delay circuit. The output of the flip-flop 221 is input to another input of the adder 211.

The amplifier 203 amplifies the output of the adder 212 and outputs the result to one input of the adder 213. The output of the adder 213 is input as one input of the selector 232 and becomes the output of the digital loop filter 200C. The output of the digital loop filter 200C is passed to the second memory 1000. From the second memory 1000, the stored output value of the digital loop filter 200C is input as another input of the selector 232.

The output of the selector 232 is input to the flip-flop 222. The amplifier 204 amplifies the output of the flip-flop 222 and outputs the result to another input of the adder 213.

The amplifiers 201, 202, 203, and 204 have been described as "amplifying" so far, but the amplification coefficients of these amplifiers 201, 202, 203, and 204 are not limited to a value larger than 1 indicating amplification. For example, the amplification coefficients of the amplifiers 201, 202, 203, and 204 may be 1 or less or a negative value as desired.

The operation clock is input to the flip-flops 221 and 222, and the flip-flops 221 and 222 update the value each time the operation clock is input by one clock.

The selectors 231 and 232 operate to select and output one of two inputs in accordance with the selector control signal input from the frequency modulated continuous wave generation circuit 700 illustrated in FIG. 16. The selector control signal changes its polarity immediately after the start of the chirp operation at the times T3, T6, and T9 and the like illustrated in FIG. 21, and the selectors 231 and 232 select a value from the second memory 1000 and stores the value in the flip-flops 221 and 222. After the value is stored in the flip-flops 221 and 222, the selector control signal returns the polarity back. Accordingly, the selectors 231 and 232 operate such that the internal node output and the digital loop filter output are selected by the selectors 231 and 232, respectively.

The configuration of the digital loop filter 200C described here is merely an example, and the configuration of the digital loop filter 200 is not limited to this example. The digital loop filter 200 may have any configuration as long as the output value of the digital loop filter can be set to be the same value as the value of the previous chirp by writing a value to the internal flip-flop at a certain time during the chirp operation.

In addition, even when the output value does not become the same value as the value of the previous chirp operation, the digital loop filter 200 may be limited to only the place where the stabilization time in the digital loop filter 200 takes the longest, so that the value of the place can be set to the same value as the value of the previous chirp.

In the above description, for convenience, the value stored in the second memory 1000 is the output of the digital loop filter 200 and the output of the adder 211, but the value stored in the second memory is not limited thereto. For example, the second memory 1000 may store one or more internal nodes of the digital loop filter 200, such as the output of the flip-flop 221, the output of the flip-flop 222, the output of the adder 212, or the output of the amplifier 204. Alternatively, the second memory 1000 may store both the internal node and the output of the digital loop filter 200.

Third Embodiment

Figure 28:
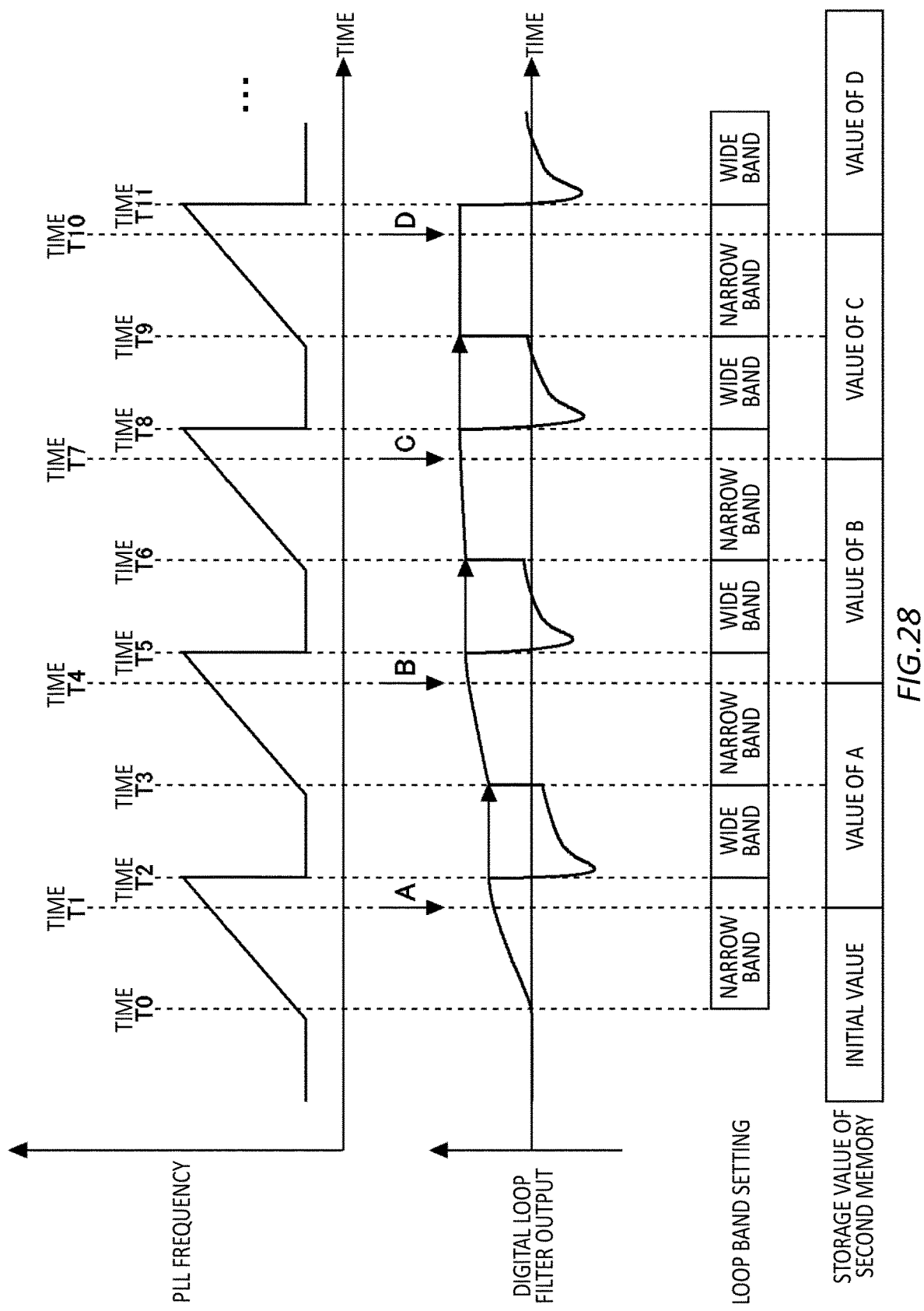
FIG. 28 is a diagram for explaining an operation during a modulation operation in a third embodiment.

FIG. 28 is a diagram for explaining an operation during a modulation operation in a third embodiment. In the third embodiment, the loop band is set to be narrow during the chirp operation during the modulation operation, so as to improve the phase noise, and the loop band is set to be wide during the period in which the radar is not used, so as to speed up the settling time.

Accordingly, the amount of change in the output of the digital loop filter 200 can be reduced at the timing of overwriting the value to the digital loop filter 200 at the times T3, T6, and T9. The large change amount means that the oscillation frequency of the DCO 400 greatly deviates from the expected ideal frequency before the value of the digital loop filter is stored. When this deviation is large, immediately after the value of the digital loop filter 200 is stored, the phase of the frequency-divided signal input to the TDC 100 greatly deviates.

As a result, this phase deviation is input to the digital loop filter 200, and the value of the digital loop filter 200 deviates from the ideal state. Although this deviation is small with respect to the error caused by the change to the first-order lag system or the error of the calibration, it is desirable to reduce the deviation since the deviation becomes a frequency error.

Figure 29:
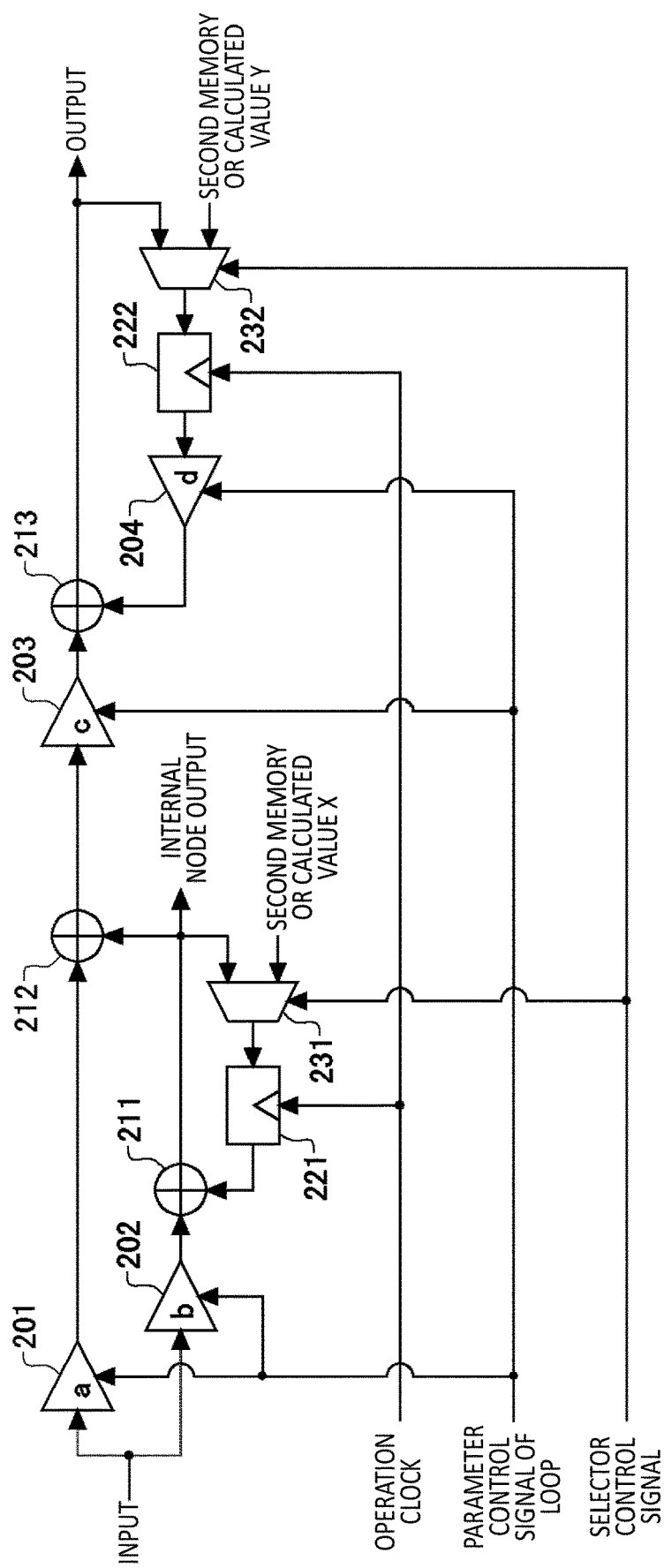
FIG. 29 illustrates an example of a digital loop filter 200D in the third embodiment.
Figure 30:
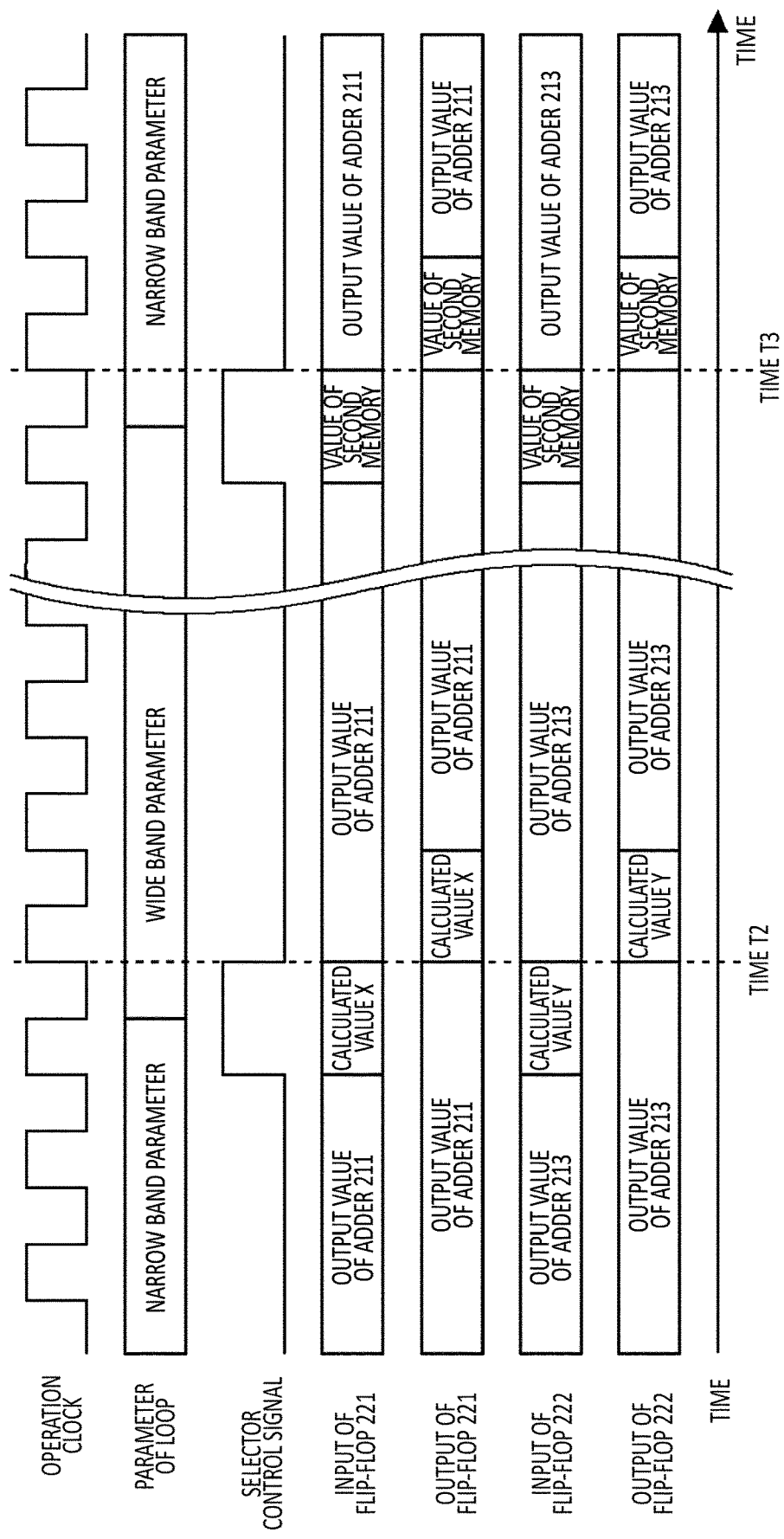
FIG. 30 illustrates an example of a timing diagram for explaining the operation of the digital loop filter 200D for a period from a time before a time T2, which is the end timing of a chirp operation period, to a time after a time T3, which is the start timing of the chirp operation period.

FIG. 29 illustrates an example of a digital loop filter 200D in the third embodiment. In addition, FIG. 30 illustrates an example of a timing diagram for explaining the operation of the digital loop filter 200D for a period from a time before the time T2, which is the end timing of the chirp operation period, to a time after the time T3, which is the start timing of the chirp operation period. Hereinafter, the operation of the loop filter 200D will be described with reference to FIGS. 29 and 30.

The digital loop filter 200D of the third embodiment is configured such that the amplification factors, which are the parameter of the digital loop filter 200D, of the amplifiers 201, 202, 203, and 204 can be changed by the control signal, in addition to the configuration of the digital loop filter 200C described in the second embodiment. That is, the PLL circuit in the third embodiment is realized by using the digital loop filter 200D as the digital loop filter 200 in the PLL circuit 30A or the PLL circuit 30B according to the second embodiment.

In addition, in the second embodiment, the inputs of the selectors 231 and 232 are values from the second memory 1000. In the third embodiment, the value of the second memory 1000 or the values of the calculated values X and Y described in the first embodiment is selected according to the state of the control signal and is input to the selectors 231 and 232.

Therefore, the selector 231 outputs, to the flip-flop 221, any one of the output of the adder 211, the calculated value X, or the value of the second memory 1000 indicating the previous control signal based on the inputs which are the output of the adder 211 and the calculated value X or the value of the second memory 1000 indicating the value of the previous control signal. Similarly, the selector 232 receives the output of the adder 213 and the calculated value Y or the value of the second memory 1000 indicating the value of the previous control signal, and outputs, to the flip-flop 222, any one of the output of the adder 213, the calculated value Y, or the value of the second memory 1000 of the PLL circuit indicating the previous control signal.

The control unit 150 may output the selector control signal. The control unit 150 switches the logic level of the selector control signal input to the selectors 231 and 232 at a time between the time T1 and the time T2 and immediately before the time T2 (which is before a timing earlier by one clock of the operation clock, for example, several clocks earlier). In response to the switching of the logic level of the selector control signal, the selector 231 switches the output from the output of the adder 211 to the output of the calculated value X. Similarly, the selector 232 switches the output from the output of the adder 213 to the output of the calculated value Y.

In the drawing, for the sake of simplicity of explanation, the logic level of the selector control signal is switched at the time T2, but may be switched after the elapse of a predetermined period immediately after the end of the time T2 which is the end timing of the chirp operation period (for example, later by several clocks of the operation clock). Accordingly, the selector 231, which is the first selector, outputs the calculated value X, which is the first calculated value, in the predetermined period immediately before the end of the chirp operation period and immediately after the end of the chirp operation period. Similarly, in this period, the selector 232, which is the second selector, outputs the calculated value Y, which is the second calculated value. The control unit 150 may further switch the amplification factors of the amplifiers 201, 202, 203, and 204 at a timing after the switching timing of the logic level of the selector control signal and before the time T2 by the control signal of the parameter of the loop.

The flip-flop 221 delays the input of the flip-flop 221 by one clock based on the output value of the selector 231 and the operation clock, and outputs the result to the adder 211. Similarly, the flip-flop 222 delays the input of the flip-flop 222 by one clock based on the output value of the selector 232 and the operation clock, and outputs the result to the amplifier 204.

Next, at the timing immediately before the time T3 (which may be a timing before time T3, for example, a timing earlier by several clocks of the operation clock than the time T3), the control unit 150 may switch the logic level of the selector control signal. The logic level of the selector control signal is a logic level set for each of the selectors 231 and 232 to output the value of the second memory 1000 indicating the previous control signal of the PLL circuit.

The control unit 150 may switch the amplification factors of the amplifiers 201, 202, 203, and 204 in a period after this timing and before the time T3 by the control signal of the parameter of the loop. In addition, in the drawing, for the sake of simplicity of explanation, the logic level of the selector control signal is switched at the time T3, but may be switched after the elapse of a predetermined period immediately after the end of the time T3 which is the start timing of the chirp operation period (for example, later by several clocks of the operation clock).

Accordingly, in the period in which the control unit 150 controls the loop bandwidth and a predetermined period immediately after the start of the chirp operation period, the selector 231 which is the first selector outputs the value of the second memory 1000 indicating the previous control signal of the PLL circuit. Similarly, in this period, the selector 232 which is the second selector outputs the value of the second memory 1000 indicating the previous control signal of the PLL circuit.

In another period (corresponding to "a period other than the predetermined period immediately after the start of the chirp operation period, immediately before the end of the chirp operation period, and immediately after the end of the chirp operation period"), the control unit 150 sets the logic level of the selector control signal such that the selector 231 outputs the output of the adder 211 which is the first adder, and the selector 232 outputs the output of the adder 213 which is the third adder.

In the third embodiment, the loop band is widened in the sections from the time T2 to the time T3, from the time T5 to the time T6, from the time T8 to the time T9, and the like illustrated in FIG. 28. In addition, in the predetermined period immediately before or immediately after the end of the chirp operation period, such as the time T2, the calculated values X and Y are output from the flip-flops 221 and 222, so that the value of the previous control signal stored in the second memory 1000 is adjusted. Accordingly, even when the sections from the time T2 to the time T3, from the time T5 to the time T6, from the time T8 to the time T9, and the like are further shortened, the error of the phase at the time of storing the value of the digital loop filter can be suppressed to be small. Therefore, in the PLL circuit including the digital loop filter 200D of the third embodiment, a more high-speed FMCW operation can be performed.

In the first embodiment, the second embodiment, and the third embodiment, a case where the FMCW modulation is performed has been described, but the application range of the configuration according to these embodiments is not limited to the FMCW modulation. These configurations can also be applied to shorten stabilization waiting time after a frequency change in a system which changes a repeatedly used frequency channel such as a wireless LAN, a mobile communication terminal, or digital broadcasting.

For example, by using the method described in the first embodiment, the loop band is changed to the wide band setting immediately before the frequency change, the settling time is shortened, and then the loop band is returned to the narrow band setting after the settling is completed. Accordingly, it is possible to shorten the waiting time in the frequency change while using the narrow band setting with excellent phase noise characteristics in the loop band at the normal time.

For example, by using the method described in the second embodiment, the value of the digital loop filter 200 when a specific frequency channel has been selected in the past can be held, and the value can be used when the frequency channel is set again, so as to shorten the stabilization time of the digital loop filter 200.

Accordingly, the PLL circuit including the digital loop filter 200 of the present embodiment can widely use the chirp modulation section which can be used for radar even in high-speed FMCW modulation, and can widen the frequency width effective for the measurement of the radar in the chirp period. Further, by using the PLL circuit of the present embodiment, the distance resolution of the radar can be improved.

While the present invention has been described with the embodiments, the technical scope of the present invention is not limited to the above-described embodiments. It is apparent to persons skilled in the art that various alterations and improvements can be added to the above-described embodiments. It is also apparent from description of the claims that the embodiments to which such alterations or improvements are made can be included in the technical scope of the present invention.

It should be noted that the operations, procedures, steps, stages, etc. of each process performed by an device, system, program, and method shown in the claims, specification, or diagrams can be performed in any order as long as the order is not indicated by "prior to," "before," or the like and as long as the output from a previous process is not used in a later process. Even if the operational flow is described by using phrases such as "first" or "next" in the claims, specification, or diagrams, it does not necessarily mean that the process must be performed in this order.

EXPLANATION OF REFERENCES

10, 20, 30: PLL circuit;
52: PFD circuit;
54: charge pump;
56: loop filter;
58: VCO;
60: modulator;
62: modulation compensation circuit;
64: multiplier;
66: frequency controller;
68: gain normalization circuit;
70: adder;
72: memory;
82, 90, 92: broken line;
84, 88, 94: solid line;
86: alternate long and short dash line;
100: TDC;
102: digital charge pump circuit;
150: control unit;
200: digital loop filter;
201, 202, 203, 204: amplifier;
211, 212, 213, 300, 1200: adder;
216: first delay circuit;
218: second delay circuit;
221, 222, 1100, 1101: flip-flop;
231, 232: selector;
400: DCO;
402: DAC;
404: analog LPF;
500: frequency divider;
502, 504: counter;
600: fractional modulation circuit;
700: frequency modulated continuous wave generation circuit;
800: predistortion circuit;
900: first memory; and
1000: second memory.

What is claimed is:
1. A PLL circuit comprising:
a digitally controlled oscillator which outputs, as an output signal, a signal having a frequency modulated according to a control signal;
a detection unit which detects a difference in at least one of a ratio or a phase of a frequency between the output signal of the digitally controlled oscillator and a reference signal;
a digital loop filter which smooths an output indicating the difference output from the detection unit and outputs, as the control signal, a resulting output to the digitally controlled oscillator;

a control signal storage unit which stores, as a previous control signal, a digital value based on the control signal output from the digital loop filter in a predetermined period immediately before end of a chirp operation period; and
a control unit which controls the digital loop filter such that the control signal output from the digital loop filter immediately after start of the chirp operation period is the previous control signal;
wherein
the detection unit includes:
  a frequency divider which frequency-divides the output signal; and
  a comparator which outputs a signal indicating a difference in at least one of a ratio or a phase of a frequency between a reference signal and an output signal of the frequency divider;
the control unit includes:
  a frequency modulated continuous wave generation circuit which outputs a frequency information signal indicating frequency information regarding a frequency continuous wave to be output from the digitally controlled oscillator during a chirp operation and a timing information signal indicating a timing of the chirp operation;
  a relationship information storage unit which stores relationship information indicating a relationship between the control signal input to the digitally controlled oscillator and a frequency of the output signal output from the digitally controlled oscillator; and
  a predistortion circuit which predistorts the frequency information based on the relationship information; and
the PLL circuit further includes:
  a fourth adder which adds an output from the digital loop filter and an output from the predistortion circuit and outputs a resulting output as the control signal to the digitally controlled oscillator.

2. The PLL circuit according to claim 1, wherein the control unit controls the digital loop filter such that the control signal output from the digital loop filter is the previous control signal by inputting the previous control signal from the control signal storage unit to the digital loop filter by time immediately after the start of the chirp operation period.

3. The PLL circuit according to claim 1, wherein the digitally controlled oscillator includes:
a DA converter which converts, into an analog signal, a digital signal based on an output from the digital loop filter; and
a voltage controlled oscillator which generates, as the output signal, a clock signal having a frequency corresponding to the analog signal output from the DA converter.

4. The PLL circuit according to claim 1, wherein the comparator includes:
a PFD circuit which outputs a pulse signal corresponding to a phase difference between the reference signal and the output signal of the frequency divider; and
a time to digital converter which outputs a signal corresponding to a pulse width of the pulse signal.

5. The PLL circuit according to claim 1, wherein the control unit further includes:
a fractional modulation circuit which outputs, to the frequency divider, a frequency setting signal obtained by performing delta sigma modulation on the frequency information signal from the frequency modulated continuous wave generation circuit.

6. The PLL circuit according to claim 5, wherein the comparator includes:
a first counter which accumulates and counts a number of at least one PLL clock that is the output signal;
a second counter which accumulates and counts a value corresponding to the frequency setting signal each time a reference clock that is the reference signal is input;
a time to digital converter which detects a phase difference between the reference clock and the PLL clock; and
an addition/subtraction circuit which outputs, as an output of the detection unit, a signal obtained by adding an output of the second counter and subtracting an output of the first counter and an output of the time to digital converter.

7. The PLL circuit according to claim 1, wherein the digital loop filter further includes:
a first amplifier which amplifies a signal output from the detection unit at a first amplification factor;
a second amplifier which amplifies the signal output from the detection unit at a second amplification factor;
a first adder to which an output of the second amplifier is input;
a first delay circuit which delays an output of the first adder by one clock and inputs a resulting output to the first adder;
a second adder to which the output of the first adder and an output of the first amplifier are input;
a third amplifier which amplifies an output of the second adder at a third amplification factor;
a third adder to which an output of the third amplifier is input;
a second delay circuit which delays an output of the third adder by one clock;
a fourth amplifier which amplifies an output of the second delay circuit at a fourth amplification factor and inputs a resulting output to the third adder;
a first selector to which the output of the first adder and the previous control signal are input and which outputs one of the output of the first adder or the previous control signal to the first delay circuit; and
a second selector to which the output of the third adder and the previous control signal are input and which outputs one of the output of the third adder or the previous control signal to the second delay circuit, and
the control unit causes the first selector and the second selector to output the previous digital value only immediately after the start of the chirp operation period, causes the first selector to output the output of the first adder in a period other than immediately after the start of the chirp operation period, and causes the second selector to output the output of the third adder.

8. The PLL circuit according to claim 1, wherein the digital loop filter further includes:
a first amplifier which amplifies a signal output from the detection unit at a first amplification factor;
a second amplifier which amplifies the signal output from the detection unit at a second amplification factor;
a first adder to which an output of the second amplifier is input;
a first delay circuit which delays an output of the first adder by one clock and inputs a resulting output to the first adder;
a second adder to which the output of the first adder and an output of the first amplifier are input;

a third amplifier which amplifies an output of the second adder at a third amplification factor;

a third adder to which an output of the third amplifier is input;

a second delay circuit which delays an output of the third adder by one clock;

a fourth amplifier which amplifies an output of the second delay circuit at a fourth amplification factor and inputs a resulting output to the third adder;

a first selector to which the output of the first adder and the previous control signal are input and which outputs one of the output of the first adder or the previous control signal to the first delay circuit; and a second selector to which the output of the third adder and the previous control signal are input and which outputs one of the output of the third adder or the previous control signal to the second delay circuit, and the control unit causes the first selector and the second selector to output the previous digital value only immediately after the start of the chirp operation period, causes the first selector to output the output of the first adder in a period other than immediately after the start of the chirp operation period, and causes the second selector to output the output of the third adder.

9. The PLL circuit according to claim 8, wherein the control unit specifies a start time point of the chirp operation period based on the timing information signal from the frequency modulated continuous wave generation circuit.

10. The PLL circuit according to claim 9, wherein the digital loop filter further includes:

a first selector to which the output of the first adder and a first calculated value are input and which outputs one of the output of the first adder or the first calculated value to the first delay circuit; and a second selector to which the output of the third adder and a second calculated value are input and which outputs one of the output of the third adder or the second calculated value to the second delay circuit, and the control unit causes the first selector to output the first calculated value and causes the second selector to output the second calculated value such that the control signal output from the digital loop filter immediately after the start of the chirp operation period has the predetermined digital value, and causes the first selector to output the output of the first adder and causes the second selector to output the output of the third adder in a period other than immediately after the start of the chirp operation period.

11. The PLL circuit according to claim 10, wherein the first calculated value and the second calculated value are determined based on the third amplification factor and the fourth amplification factor before switching and the third amplification factor and the fourth amplification factor after switching.

12. A PLL circuit comprising:

a digitally controlled oscillator which outputs, as an output signal, a signal having a frequency modulated according to a control signal;

a detection unit which detects a difference in at least one of a ratio or a phase of a frequency between the output signal of the digitally controlled oscillator and a reference signal;

a digital loop filter which smooths an output indicating the difference output from the detection unit and outputs, as the control signal, a resulting output to the digitally controlled oscillator; and a control unit which controls the digital loop filter such that a loop bandwidth of the digital loop filter during a non-chirp operation period in which a chirp operation is not performed is a first bandwidth, controls the digital loop filter such that the loop bandwidth of the digital loop filter during a chirp operation period in which the chirp operation is performed is a second bandwidth narrower than the first bandwidth, and further controls the digital loop filter such that the control signal output from the digital loop filter in a period in which the loop bandwidth is controlled and immediately after start of the chirp operation period has a predetermined digital value;

wherein the detection unit includes:

a frequency divider which frequency-divides the output signal; and a comparator which outputs a signal indicating a difference in at least one of a ratio or a phase of a frequency between a reference signal and an output signal of the frequency divider;

the control unit includes:

a frequency modulated continuous wave generation circuit which outputs a frequency information signal indicating frequency information regarding a frequency continuous wave to be output from the digitally controlled oscillator during a chirp operation and a timing information signal indicating a timing of the chirp operation;

a relationship information storage unit which stores relationship information indicating a relationship between the control signal input to the digitally controlled oscillator and a frequency of the output signal output from the digitally controlled oscillator; and a predistortion circuit which predistorts the frequency information based on the relationship information; and the PLL circuit further includes:

a fourth adder which adds an output from the digital loop filter and an output from the predistortion circuit and outputs a resulting output as the control signal to the digitally controlled oscillator.

13. The PLL circuit according to claim 12, further comprising:

a control signal storage unit which stores, as a previous control signal, a digital value based on the control signal output from the digital loop filter in a predetermined period immediately before end of the chirp operation period, wherein the control unit controls the digital loop filter such that the control signal output from the digital loop filter in the period in which the loop bandwidth is controlled and immediately after the start of the chirp operation period is the previous control signal.

14. The PLL circuit according to claim 13, wherein the digitally controlled oscillator includes:

a DA converter which converts, into an analog signal, a digital signal based on an output from the digital loop filter; and a voltage controlled oscillator which generates, as the output signal, a clock signal having a frequency corresponding to the analog signal output from the DA converter.

15. The PLL circuit according to claim 13, wherein the digital loop filter further includes:

a first amplifier which amplifies a signal output from the detection unit at a first amplification factor;
a second amplifier which amplifies the signal output from the detection unit at a second amplification factor;
a first adder to which an output of the second amplifier is input;
a first delay circuit which delays an output of the first adder by one clock and inputs a resulting output to the first adder;
a second adder to which the output of the first adder and an output of the first amplifier is input;
a third amplifier which amplifies an output of the second adder at a third amplification factor;
a third adder to which an output of the third amplifier is input;
a second delay circuit which delays an output of the third adder by one clock;
a fourth amplifier which amplifies an output of the second delay circuit at a fourth amplification factor and inputs a resulting output to the third adder;
a first selector to which the output of the first adder and the previous control signal are input and which outputs one of the output of the first adder or the previous control signal to the first delay circuit; and
a second selector to which the output of the third adder and the previous control signal are input and which outputs one of the output of the third adder or the previous control signal to the second delay circuit, and
the control unit causes the first selector and the second selector to output the previous digital value only immediately after the start of the chirp operation period, causes the first selector to output the output of the first adder in a period other than immediately after the start of the chirp operation period, and causes the second selector to output the output of the third adder.

16. The PLL circuit according to claim 12, wherein the digital loop filter includes:
a first amplifier which amplifies a signal output from the detection unit at a first amplification factor;
a second amplifier which amplifies the signal output from the detection unit at a second amplification factor;
a first adder to which an output of the second amplifier is input;
a first delay circuit which delays an output of the first adder by one clock and inputs a resulting output to the first adder:
a second adder to which the output of the first adder and an output of the first amplifier are input;
a third amplifier which amplifies an output of the second adder at a third amplification factor;
a third adder to which an output of the third amplifier is input;
a second delay circuit which delays an output of the third adder by one clock; and
a fourth amplifier which amplifies an output of the second delay circuit at a fourth amplification factor and inputs a resulting output to the third adder, and
the control unit switches a loop band of the digital loop filter to one of the first bandwidth or the second bandwidth by switching the first amplification factor, the second amplification factor, the third amplification factor, and the fourth amplification factor.

17. The PLL circuit according to claim 16, further comprising:
a control signal storage unit which stores, as a previous control signal, a digital value based on the control signal output from the digital loop filter in a predetermined period immediately before end of the chirp operation period, wherein
the digital loop filter further includes:
a first selector to which the output of the first adder and the previous control signal are input and which outputs one of the output of the first adder or the previous control signal to the first delay circuit; and
a second selector to which the output of the third adder and the previous control signal are input and which outputs one of the output of the third adder or the previous control signal to the second delay circuit, and
the control unit causes the first selector to output the previous control signal and causes the second selector to output the previous control signal such that the control signal output from the digital loop filter immediately after the start of the chirp operation period has the predetermined digital value, and causes the first selector to output the output of the first adder and causes the second selector to output the output of the third adder in a period other than immediately after the start of the chirp operation period.

18. The PLL circuit according to claim 16, further comprising:
a control signal storage unit which stores, as a previous control signal, a digital value based on the control signal output from the digital loop filter in a predetermined period immediately before end of the chirp operation period, wherein
the digital loop filter further includes:
a first selector to which the output of the first adder and a first calculated value or the previous control signal are input and which outputs any one of the output of the first adder, the first calculated value, or the previous control signal to the first delay circuit; and
a second selector to which the output of the third adder and a second calculated value or the previous control signal are input and which outputs any one of the output of the third adder, the second calculated value, or the previous control signal to the second delay circuit; and
the control unit causes the first selector to output the previous control signal and causes the second selector to output the previous control signal in a period in which the loop bandwidth is controlled and a predetermined period immediately after the start of the chirp operation period, causes the first selector to output the first calculated value and causes the second selector to output the second calculated value in a predetermined period immediately before and immediately after the end of the chirp operation period, and causes the first selector to output the output of the first adder and causes the second selector to output the output of the third adder in a period other than the predetermined period immediately after the start of the chirp operation period and the predetermined period immediately before and immediately after the end of the chirp operation period.

* * * * *